US012700562B2

(12) United States Patent
Jen et al.

(10) Patent No.: US 12,700,562 B2
(45) Date of Patent: Aug. 4, 2026

(54) METHOD AND APPARATUS FOR CONTINUOUS CHAINED ENERGY ION IMPLANTATION

(71) Applicant: Axcelis Technologies, Inc., Beverly, MA (US)

(72) Inventors: Causon Jen, San Jose, CA (US); James S. DeLuca, Beverly, MA (US); William Bintz, Londonderry, NH (US)

(73) Assignee: Axcelis Technologies, Inc., Beverly, MA (US)

( * ) Notice: Subject to any disclaimer, the term of this patent is extended or adjusted under 35 U.S.C. 154(b) by 441 days.

(21) Appl. No.: 17/881,833

(22) Filed: Aug. 5, 2022

(65) Prior Publication Data

US 2023/0038565 A1    Feb. 9, 2023

Related U.S. Application Data

(60) Provisional application No. 63/229,751, filed on Aug. 5, 2021, provisional application No. 63/229,663, filed on Aug. 5, 2021.

(51) Int. Cl.
*H01J 37/147* (2006.01)
*C23C 14/48* (2006.01)
(Continued)

(52) U.S. Cl.
CPC .......... *H01J 37/1474* (2013.01); *C23C 14/48* (2013.01); *C23C 14/54* (2013.01);
(Continued)

(58) Field of Classification Search
CPC ........ H01J 37/1474; H01J 37/08; H01J 37/20; H01J 37/304; H01J 37/3171;
(Continued)

(56) References Cited

U.S. PATENT DOCUMENTS 4,980,562 A    12/1990 Berrian et al.
5,091,655 A    2/1992 Dykstra et al.
(Continued)

FOREIGN PATENT DOCUMENTS

TW    200816255 A    4/2008
TW    202107513 A    2/2021
(Continued)

OTHER PUBLICATIONS

International Search Report dated Nov. 18, 2022 in connection with PCT/US2022/039553.
(Continued)

*Primary Examiner* — Robert H Kim
(74) *Attorney, Agent, or Firm* — Eschweiler & Potashnik, LLC

(57) ABSTRACT

An ion implantation system and method that selectively varies an ion beam energy to a workpiece in sequential passes thereof in front of the beam. The implantation system has an ion source for generating the ion beam and an acceleration/deceleration stage for varying the energy of the ion beam based on an electrical bias supplied to the acceleration deceleration stage. A workpiece support is provided immediately downstream of the acceleration/deceleration stage to support a workpiece through the selectively varied energy ion beam, and can be thermally controlled to control a temperature of the workpiece during the variation of energy of the beam. The energy can be varied while the workpiece is positioned in front of the beam, and a controller can control the electrical bias to control the variation in energy of the ion beam, where a plurality of process recipes can be attained during a single positioning of the workpiece on the workpiece support.

20 Claims, 6 Drawing Sheets

(51) Int. Cl.

| | |
|---|---|
| *C23C 14/54* | (2006.01) |
| *H01J 37/08* | (2006.01) |
| *H01J 37/20* | (2006.01) |
| *H01J 37/304* | (2006.01) |
| *H01J 37/317* | (2006.01) |

(52) U.S. Cl.
CPC .............. *H01J 37/08* (2013.01); *H01J 37/20* (2013.01); *H01J 37/304* (2013.01); *H01J 37/3171* (2013.01); *H01J 2237/047* (2013.01); *H01J 2237/0473* (2013.01); *H01J 2237/0475* (2013.01); *H01J 2237/202* (2013.01); *H01J 2237/2065* (2013.01); *H01J 2237/2445* (2013.01); *H01J 2237/2482* (2013.01)

(58) Field of Classification Search
CPC ......... H01J 2237/047; H01J 2237/0473; H01J 2237/0475; H01J 2237/202; H01J 2237/2065; H01J 2237/2445; H01J 2237/2482; H01J 2237/30472; H01J 37/3023; H01J 2237/2001; H01J 37/04; C23C 14/48; C23C 14/54; C23C 14/541; C23C 14/56
See application file for complete search history.

(56) References Cited

U.S. PATENT DOCUMENTS

| | | |
|---|---|---|
| 5,177,366 A | 1/1993 | King et al. |
| 5,244,820 A | 9/1993 | Kamata et al. |
| 5,393,984 A | 2/1995 | Glavish |
| 6,055,460 A | 4/2000 | Shopbell |
| 6,441,382 B1 | 8/2002 | Huang |
| 6,744,377 B1 | 6/2004 | Inoue |
| 6,777,696 B1 | 8/2004 | Rathmell et al. |
| 7,112,809 B2 | 9/2006 | Rathmell et al. |
| 7,507,978 B2 | 3/2009 | Vanderberg et al. |
| 7,550,751 B2 | 6/2009 | Benveniste et al. |
| 7,615,763 B2 | 11/2009 | Vanderberg et al. |
| 7,655,933 B2 | 2/2010 | England et al. |
| 8,124,946 B2 | 2/2012 | Ryding et al. |
| 8,450,193 B2 | 5/2013 | England et al. |
| 9,048,276 B2 | 6/2015 | Lee et al. |
| 9,218,941 B2 | 12/2015 | Jen et al. |
| 9,236,216 B2 | 1/2016 | Lee et al. |
| 9,378,992 B2 * | 6/2016 | Huseinovic .......... H01J 37/185 |
| 9,443,698 B2 | 9/2016 | Vanderberg |
| 10,083,815 B2 | 9/2018 | Lane |
| 10,128,084 B1 | 11/2018 | Baggett et al. |
| 11,670,483 B2 | 6/2023 | Ferrara |
| 2009/0206270 A1 | 8/2009 | Glayish et al. |
| 2015/0200073 A1 * | 7/2015 | Jen ...................... H01J 37/3171 250/281 |

FOREIGN PATENT DOCUMENTS

| | | |
|---|---|---|
| WO | 9908306 A1 | 2/1999 |
| WO | 2014145898 A2 | 9/2014 |

OTHER PUBLICATIONS

Amemiya K. et al. Development of a continuously variable energy radio frequency quadrupole accelerator for SiC power semiconductor device fabrication. vol. 188, No. 1-4; Published Apr. 1, 2002, pp. 247-250.

* cited by examiner

METHOD AND APPARATUS FOR CONTINUOUS CHAINED ENERGY ION IMPLANTATION

REFERENCE TO RELATED APPLICATIONS

This application claims the benefit of U.S. Provisional Application Ser. No. 63/229,663 filed Aug. 5, 2021, entitled, "CHAINED MULTIPLE ENERGY IMPLANT PROCESS STEPS" and U.S. Provisional Application Ser. No. 63/229,751 filed Aug. 5, 2021, entitled, "BLENDED ENERGY ION IMPLANTATION", the contents of all of which are herein incorporated by reference in their entirety.

FIELD

The present invention relates generally to ion implantation systems and processes, and more specifically to a system and method for delivering a selectively controlled variable energy ion beam to a workpiece during ion implantation thereof.

BACKGROUND

In the manufacture of semiconductor devices, ion implantation is used to dope semiconductors with impurities. Ion implantation systems and methods are utilized to dope a workpiece, such as a semiconductor wafer, with ions from an ion beam, in order to either produce n- or p-type material doping, or to form passivation layers during fabrication of an integrated circuit, among other processes. Such beam treatment is often used to selectively implant the wafers with impurities of a specified dopant material, at a predetermined energy level, and in controlled concentration or dose, to produce a semiconductor material during fabrication of an integrated circuit. When used for doping semiconductor wafers, the ion implantation system injects a selected ion species into the workpiece to produce the desired extrinsic material. Implanting ions generated from source materials such as antimony, arsenic, or phosphorus, for example, results in an "n-type" extrinsic material wafer, whereas a "p-type" extrinsic material wafer often results from ions generated with source materials such as boron, gallium, or indium.

A typical ion implanter includes an ion source, an ion extraction device, a mass analysis device, a beam transport device and a wafer processing device. The ion source generates ions of desired atomic or molecular dopant species. These ions are extracted from the source by an extraction system, typically a set of electrodes, which energizes and directs the flow of ions from the source, forming an ion beam. Desired ions are separated from the ion beam in a mass analysis device, typically a magnetic dipole performing mass dispersion or separation of the extracted ion beam. The beam transport device, typically a vacuum system containing a series of focusing devices and other subsystems that manipulate the ion beam, transports the ion beam to the wafer processing device while maintaining or improving desired properties of the ion beam. Finally, semiconductor wafers are transferred in to and out of the wafer processing device via a wafer handling system, which may include one or more robotic arms, for placing a wafer to be treated in front of the ion beam and removing treated wafers from the ion implanter.

Present ion implantation technology establishes a recipe to implant a specific condition into a workpiece, also called a substrate or wafer. Such a recipe results in a given concentration profile within the substrate that is generally determined by a type or desired species of dopant being implanted, density and composition of the workpiece, and implant conditions such as an energy of the implanted species, the implant angle (e.g., tilt or twist) of the ion beam relative to a surface of the workpiece, and the total dose of implantation.

In order to establish a desired dopant profile that a single energy implant step cannot provide, it is typical to conduct multiple implant steps of the same species on the same substrate, generally using different combinations of energy, dose, tilt or twist. While dose, tilt and twist may be adjustable within a single implant cycle by breaking the implant process into multiple steps or a so-called "chain" of implant steps, changing the energy of the implant generally typically necessitates significant adjustments to various settings of the ion implantation system in the absence of the workpiece due to potential contamination, whereby the adjustments add setup time involved in making said adjustments, thus affecting productivity of the ion implantation system and process. Meanwhile, workpiece handling and hardware can induce particle contamination, workpiece misalignments and/or catastrophic wafer drops associated with removing the workpiece from the process environment to accommodate said adjustments.

Thus, the present invention contemplates an ion implantation system and process, wherein an energy chain implant can be carried out such that the ion beam energy can be selectively varied and delivered to a workpiece for implantation of ions therein while the workpiece is maintained on a workpiece support concurrent with the selective variation of ion beam energy.

Moreover, adjustments to upstream components, such as to an ion source and ion extraction device, typically result in requirements to make further adjustments to downstream components, such as a mass analysis device and beam transport device, and may necessitate removal and replacement of the substrate or workpiece from and to the process environment between each of the implant steps, which further affects productivity of the implant process. Meanwhile, workpiece handling and hardware can induce particle contamination, workpiece misalignments and/or catastrophic wafer drops.

The present disclosure appreciates that this issue is of particular concern in low and/or high temperature implants, wherein thermal budgeting constraints limit a desired length of time that the workpiece is exposed to increased or decreased temperatures.

SUMMARY

The present disclosure contemplates an ion implantation system and process, wherein an energy chain implant can be carried out such that the ion beam energy can be selectively varied and delivered to a workpiece for implantation of ions therein while the workpiece is maintained on a workpiece support concurrent with the selective variation of ion beam energy. Thus, the present disclosure provides a system, apparatus, and method for supplying an ion beam to a workpiece having a selectively variable energy. Accordingly, the following presents a simplified summary of the disclosure in order to provide a basic understanding of some aspects of the invention. This summary is not an extensive overview of the invention. It is intended to neither identify key or critical elements of the invention nor delineate the scope of the invention. Its purpose is to present some concepts of the invention in a simplified form as a prelude to the more detailed description that is presented later.

In accordance with one example aspect, an ion implantation system for producing a chained energy implantation of ions is provided, wherein the ion implantation system comprises an ion source configured to ionize a dopant material and generate an ion beam. An acceleration/deceleration stage, for example, is configured to receive the ion beam, wherein the acceleration/deceleration stage is configured to selectively vary an energy of the ion beam based on one or more inputs thereto, thereby defining a selectively variable energy ion beam. Further, a single workpiece end station is positioned downstream of the acceleration/deceleration stage, wherein the single workpiece end station comprises a workpiece support configured to selectively position and maintain a single workpiece before the selectively variable energy ion beam for continuous ion implantation. The single workpiece, for example, is maintained on the workpiece support within the end station concurrent with the selective variation of the energy of the ion beam.

According to another example aspect, an ion implantation system is configured to provide a selectively variable energy ion beam to a workpiece. The ion implantation system comprises an ion source configured to ionize a dopant material and generate an ion beam and an acceleration/deceleration stage configured to receive the ion beam. The acceleration/deceleration stage is configured to selectively vary an energy of the ion beam based on one or more inputs to the acceleration/deceleration stage, thereby defining the selectively variable energy ion beam. An end station, for example, is positioned downstream of the acceleration/deceleration stage, wherein the end station comprises a workpiece support configured to selectively position the workpiece before the selectively variable energy ion beam for ion implantation thereby. The workpiece, for example, is maintained on the workpiece support within the end station concurrent with the selective variation of the energy of the ion beam. Further, a thermal apparatus, for example, is configured to control a temperature of the workpiece at a predetermined processing temperature on the workpiece support. The predetermined process temperature, for example, is associated with one of a high temperature configuration of the ion implantation system and a low temperature configuration of the ion implantation system, wherein the workpiece is maintained on the workpiece support within the end station concurrent with the selective variation of the energy of the ion beam.

In yet another example aspect, an ion implantation system is configured to provide a selectively variable energy ion beam to a workpiece and comprises an ion source configured to ionize a dopant material and generate an ion beam. An acceleration/deceleration stage is configured to receive the ion beam, wherein the acceleration/deceleration stage is configured to selectively vary an energy of the ion beam based on one or more inputs to the acceleration/deceleration stage thereby defining the selectively variable energy ion beam. Further, an end station is positioned downstream of the acceleration/deceleration stage, wherein end station comprises a workpiece support configured to selectively position the workpiece before the selectively variable energy ion beam for ion implantation thereby, wherein the workpiece is maintained within the end station and continuously exposed to the ion beam concurrent with the selective variation of the energy of the ion beam.

To the accomplishment of the foregoing and related ends, the disclosure comprises the features hereinafter fully described and particularly pointed out in the claims. The following description and the annexed drawings set forth in detail certain illustrative embodiments of the invention. These embodiments are indicative, however, of a few of the various ways in which the principles of the invention may be employed. Other objects, advantages and novel features of the invention will become apparent from the following detailed description of the invention when considered in conjunction with the drawings.

DETAILED DESCRIPTION

Figure 1A:
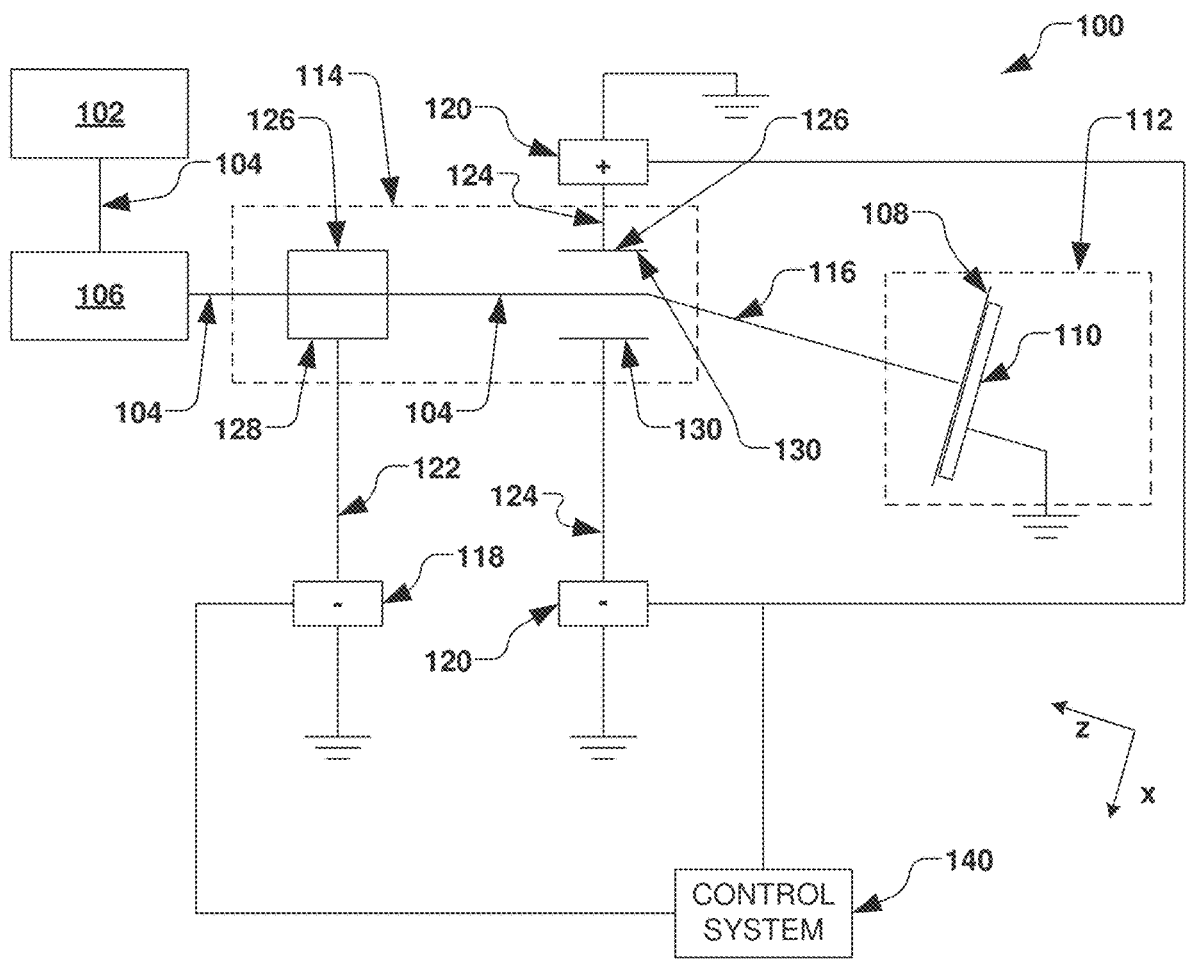
FIG. 1A is a block diagram of a portion of an ion implantation system in accordance with several aspects of the present disclosure.

The present disclosure provides a system and method to implant a selectively variable distribution of energies (e.g., at equal or varying doses) across multiple sequential implant steps, without adjustments and modification to various beamline components and/or workpiece removal and replacement from and to the processing environment, as previously seen. For example, the present disclosure provides various processes ranging from as simple as implanting two discrete energies in sequential implant steps while maintaining the workpiece on a platen or chuck in a processing chamber, to more complex processes having a continuous distribution or range of energies implanted into a workpiece over a series of sequential implant steps, once again without the removal of the workpiece from the platen or chuck in the processing chamber, and thereafter reintroducing and repositioning the workpiece on the platen or chuck in the process chamber. For example, the present disclosure can be utilized when a need exists for generating a box-shaped profile of dopant concentration vs. depth which may be seen in semiconductor device manufacturing.

The present disclosure is particularly advantageous in low and/or high temperature implants such as described in U.S. Pat. No. 8,450,193 to England et al., and U.S. Pat. No. 9,048,276 to Lee et al., the content of which are incorporated herein in their entireties, as well as various in other systems wherein thermal budgeting constraints limit a desired length of time that the workpiece is exposed to increased or decreased temperatures.

In a single-wafer ion implant process, for example, a control system is used to "tune" an ion beam from ion source to the end of a final stage, such as for example, a horizontal angle corrector magnet. The tuning process adjusts power supplies coupled to a series of components that modify operating parameters affecting the ion beam over a series of predefined steps as the beam travels through a beamline. For example, the tuning process can include adjusting various electrical biases supplied to various components in a beamline, such as, for example, focusing elements such as a quadrupole lens; deceleration or acceleration electrodes and/or steering, deflection or bend electrodes while recording the appropriate angular offsets needed to compensate the beam angle relative to the workpiece.

In the simplest embodiment of the present invention, energy changes are made in steps within a series of implant steps to enable a series of sequential implant steps at different energies on a single workpiece, all while maintaining the workpiece on a platen within a processing station in its original position (e.g., maintaining a workpiece on an electrostatic chuck within a process chamber or process environment).

In an example implant, a first workpiece is loaded to the platen, which can comprise electrostatically clamping the workpiece to an electrostatic chuck coupled to a scan mechanism. The first workpiece is implanted with a dose at a first energy, (e.g., a first sequential implant step). Thereafter, a next combination of voltages, offsets, waveforms and reference values are loaded and a second energy (e.g., a second sequential implant step) is implanted. This process can be repeated through all the desired energies and implant steps before the first workpiece is removed from the platen and scan mechanism. Subsequently, a second workpiece can be loaded onto the platen, and the control system can return to the first energy and iterate through the steps described above for the first workpiece, and so on.

Heretofore, such energy modifications amongst a series of sequential implant steps while maintaining the workpiece on the platen was not contemplated, as the modifications to various system components typically required to make such energy modifications were considered to be too time consuming, thus deleteriously affecting throughput. In particular, maintaining a workpiece on a high temperature platen in the case of heated implants, for example, has been heretofore considered impracticable due to thermal budget constraints (e.g., a term that defines a total amount of thermal energy transferred to the workpiece during the given elevated temperature operation, which is typically proportional to temperature and duration of the process).

In accordance with the present disclosure, the inventors innovatively appreciate that the final energy of an ion implant step can be changed by adjusting, modifying, or otherwise controlling one or more electrical biases supplied to one or more downstream energy adjusting elements such as a final acceleration/deceleration stage (e.g., an angular energy filter or "AEF", bending elements, etc.) along the beamline. Scanner waveforms for scanning the ion beam, for example, can be further based, at least in part, on the voltage applied to the one or more power supplies associated with the acceleration/deceleration stage. For example, a voltage applied to one or more power supplies associated with one or more beam bending elements configured to bend the ion beam once it attains its final energy can be "servo'd off" of the voltage applied to the one or more power supplies associated with an acceleration/deceleration stage. A controller, for example, is configured to alter, vary, maintain, or otherwise provide the voltage to the respective accel/decel stage and post-final energy elements.

The energy control and adjustment capabilities provided by the present disclosure advantageously minimize handling of workpieces being processed. For example, as opposed to conventional systems where workpieces are transferred multiple times between load lock chambers and a process chamber to achieve a multiple-energy chained implant, the present disclosure enables implant of all desired energies into the workpiece while maintaining the workpiece in the process chamber, without removal therefrom, thus resulting in higher system productivity and/or lower yield losses due to handling errors or queue time effects.

The present disclosure, for example, is advantageous in ion implantation systems (generically called "implanters") having a downstream accelerator/deceleration capability (e.g., batch implanters configured to implant workpieces via spot ion beams, as well as single-workpiece implanters configured to implant workpieces via scanned or ribbon ion beams). For example, in order to maintain energy purity in such implanters, an angular energy filter can be provided as a final component prior to the ion beam impacting the workpiece to selectively implant the workpiece with an ion beam at a desired final energy, whereby off-energy particles are filtered out.

By contrast, some implanters having post-acceleration magnets and other components for beam parallelism, for example, which typically suffer from limitations wherein such post acceleration magnets and components typically also go through a series of adjustments in order to create an ion beam having the desired characteristics. Such a series of adjustments are undesirable due to the time necessary for making such adjustments. The present disclosure, however, does not exclude such systems that may use beamline elements post-acceleration to accomplish similar capabilities. Further, with regard to plasma doping systems or so-called Plasma Immersion Ion Implant (PIII), the present disclosure also provides for a dynamically tunable implant energy for non-mass-selected species over a broader energy range than practically possible with conventional plasma doping.

In co-owned U.S. Pat. No. 9,218,941, the contents of which are hereby incorporated by reference, herein, a single wafer implant system is provided with an exemplary beamline arrangement configured to provide a synchronization of energy adjustment with the ion beam scan to construct a patterned energy implant across a wafer. With such beamline arrangement, the prior art described above can also realize an energy chain implant capability in a single wafer implant system while maintaining the wafer on a wafer support in the process chamber in accordance with the present invention.

In conventional single-wafer ion implantation systems, on the other hand, it has not been considered practical to perform energy chain implants to a wafer to receive multiple implant steps with different energies and doses while maintaining a wafer at the platen. Most conventional single-wafer implantation systems require an extended time period to re-tune the ion beam when changing energies due to beamline architecture designs. Therefore, in order to maintain a wafer at the platen (e.g., a clamp or electrostatic chuck (ESC)) for receiving multiple implant steps with different energies, conventional systems would typically require multiple time-consuming re-tuning operations on the beamline between energy changes, thus lowering productivity of the systems.

However, the present disclosure contemplates that an acceleration/deceleration component is situated downstream in a beamline such that there are no components that require tuning downstream of the acceleration/deceleration component. As such, the present disclosure involves a downstream acceleration/deceleration component configured to selectively vary the energy of the ion beam in combination with a single workpiece end station including a single workpiece support configured to continuously maintain only the single workpiece in front of the selectively variable energy ion beam and concurrent with the selective energy variation thereof.

The problems encountered with respect to conventional single-wafer ion implantation systems, for example, can be exacerbated in high temperature implant processes, whereby the wafer is either preheated prior to being placed on the ESC or heated on the ESC, for subsequent implantation of ions into the wafer. In this case, it is not conventionally acceptable to maintain the wafer on the ESC during energy changes, as the time involved in making such energy changes will either allow the wafer temperature to decrease below the desired implant temperature, or cause the wafer to be exposed to a high temperature for an extended period of time. Examples of high temperature ion implants process and systems can be found in U.S. Pat. No. 7,655,933 to England et al. and U.S. Pat. No. 9,378,992 to Huseinovic, et al., the contents of which are hereby incorporated by reference in their entirety, herein.

Likewise, complications related to long tune times when varying implant energies and maintaining a wafer at the platen between different energy implants can be problematic in low temperature implant processes, where the wafer is either pre-cooled prior to being placed on the ESC, chilled on the ESC, and/or heated post-implant to reduce a likelihood of condensation on the wafer after implantation. In such cases, it may be difficult to maintain the wafer at the desired low temperature while maintaining the wafer on the ESC during time consuming energy changes and associated retuning of various beamline components typically associated therewith, thereby necessitating additional wafer handling steps to move the wafer to a pre-chill station. Once again, these wafer handling steps may be time consuming, resulting in lost productivity, and/or may introduce contaminants on the wafer, resulting in lost yields. Examples of low temperature ion implant processes and systems can be found in U.S. Pat. No. 5,244,820 to Kamata et al. and U.S. Pat. No. 9,236,216 to Lee et al., the contents of which are also hereby incorporated by reference in their entirety, herein.

The present disclosure advantageously addresses these shortcomings and provides a high productivity implantation system configured to accomplish energy chain implants while maintain the wafer on a wafer support in front of the ion beam concurrent with the selective variation of the energy of the beam, thereby improving workpiece defect rates and device performance by minimizing workpiece load/unload frequencies and associated breaks in the high-vacuum environment of the implantation system between energy changes.

The present disclosure thus provides various systems, apparatuses, and methods for providing an energy chain implant, whereby a workpiece can be exposed to a plurality of energies of the ion implantation process while being continuously presented before the ion beam without removing the workpiece from a process environment, or even removing the workpiece from platen such as an electrostatic clamp on which it resides during implantation. The present disclosure is further advantageous in temperature-controlled ion implantations, whereby the workpiece resides on a single heated or cooled clamp during energy changes, thus improving productivity and various other benefits in hot and/or cold ion implantation applications.

In accordance with one example aspect of the present invention, the present disclosure provides an energy chain implant, whereby multiple implantation operations are performed sequentially, such as implantation operations involving multiple energies and/or doses using the same ion species. A continuous energy chain implant capability provided in the present disclosure can not only provide increased productivity, but can also provide device benefits when a specific implant ion profile is desired having multiple energies in-situ, without breaking the high vacuum environment to expose the workpiece to atmosphere. Additionally, the present disclosure provides for expeditious modification and optimization of an implant profile for improved device performance, whereby such modifications and optimization can be implemented without deleteriously affecting production efficiencies and device yields.

The system and method of the present disclosure, for example, is particularly advantageous when the system is configured to temperature-controlled implants, such as in hot or cold implant applications. In a hot implant application, for example, a workpiece may be loaded to a preheat station to heat the workpiece from room temperature to a predetermined temperature. The predetermined temperature, for example, may be lower than the final desired temperature for implantation. Once the workpiece is preheated, it may be placed onto a heated ESC and heated further to a final desired temperature prior to implantation commencing. After the workpiece continuously and sequentially exposed to an ion beam having varying energies to thereby implant ions into the workpiece at varying depths, the workpiece is removed from the heated ESC and placed in a post-implant cooling station before it is moved to atmosphere.

In a relatively low-dose implant case (e.g., where the time the ion beam implants on the workpiece is short), the preheat time, post-cool time, as well as time taken to heat the workpiece to the final desired temperature on ESC can all be in the so-called critical path of the ion implantation process and can impact system productivity. In a relatively high-dose implant case (e.g., where the preheat time and post-cool are short compared to the implant time), such times may not be in a critical path, but the time spent to heat the workpiece from the preheat temperature to the final desired temperature at the ESC is likely still in the critical path.

As such, high temperature implants, or so-called "hot" implants, have the capacity to significantly reduce system productivity due to the additional time spent controlling the temperature of the workpiece at different stages described above. The present disclosure provides an energy chain implant that can be implemented for a hot implant application, whereby the workpiece can remain on the heated ESC until a sequence of all individual hot implants at a plurality of energies can be completed. In accordance with the present disclosure, therefore, a process is provided for heating the workpiece to an elevated temperature once (e.g., from the preheat temperature to the final desired temperature on the ESC), rather than heating the workpiece multiple times, as conventionally seen. Accordingly, the energy chain implant of the present disclosure can significantly improve system productivity and increase potential device yield or performance benefits.

In accordance with another example, the energy chain implant of the present disclosure can further reduce defects for integrated circuit fabrication at advanced technology nodes seen in today's devices. For example, mechanical movement associated with transporting a workpiece multiple times between atmosphere and a process chamber can add particles and defects to the workpiece, leading to low yields. Defect reduction is particularly important in today's sub-nanometer semiconductor technology fabrication. The presently disclosed energy chain implant system, apparatus, and method can greatly reduce the total movement of workpieces (e.g., load/unload) compared to a chain implant that may require the workpiece and workpiece support to be removed from the beam path while energy variations are implemented in the beamline, or that may require the workpiece to be removed from the end station, whereby defect reductions can be expected to improve device yield rate.

In order to provide a general overview of various concepts of the present disclosure, FIG. 1A illustrates an example of a system 100 for implanting ions having a continuous chained energy ion implantation. In accordance with one example, the system 100 comprises an ion source 102 configured to ionize a dopant material for generating an ion beam 104. A beamline assembly 106 is positioned downstream of the ion source 102, wherein the beamline assembly is configured to transport the ion beam 104 toward a workpiece 108 positioned on a workpiece support 110 (e.g., a chuck) in an end station 112.

An acceleration/deceleration stage 114, for example, is further provided and configured to receive the ion beam 104 during transport thereof, and to produce a variable energy ion beam 116 for implantation into the workpiece 108 that is selectively positioned within the end station 112. In one example, one or more variable power sources 118, 120 (e.g., one or more power supplies) are operably coupled to the acceleration/deceleration stage 114 and respectively provide one or more electrical bias signals 122, 124 (e.g., a voltage or a current) thereto.

The one or more electrical bias signals 122, 124, for example, are applied to one or more electrodes 126 positioned above and below the ion beam 104 as it passes through the acceleration/deceleration stage 114. The acceleration/deceleration stage 114 can include one or more acceleration/deceleration electrodes 128 for example, and one or more bend electrodes 130, whereby the electrical bias signals 122 applied to the acceleration/deceleration electrodes yield the variable energy ion beam 116, and the electrical bias signals 124 applied to the bend electrodes yield angular control of the ion beam 104. The one or more electrical bias signals 122, 124, for example, are further selectively varied a controller 140 (e.g., a control system comprising one or more control apparatuses). For example, selective control of the one or more electrical bias signals 122, 124 is provided via a control of the one or more power sources 118, 120. The controller 140 is further operable to control other aspects of the system 100, such as the workpiece support 110, and other components of the beamline assembly 106, such as a beam scanning mechanism, focusing and steering elements or other beam control components, as will be discussed further infra.

In one example, control and feedback signals 142 between the controller 140 and the one or more power sources 118, 120 selectively control and vary an energy of the ion beam 104 to define the variable energy ion beam 116. For example, control of the electrical bias signal 122 (e.g., a deceleration voltage) supplied to the acceleration/deceleration electrodes 128 can selectively vary (increase and decrease) the energy of the ion beam 104. Similarly, control of the electrical bias signal 124 supplied to the one or more bend electrodes 130 can selectively bend the ion beam 104 upward or downward. The one or more bend electrodes 130, for example, are configured to deflect the ion beam 104 in a predetermined manner based on the desired beam energy for filtering of ions of extraneous energies out of the ion beam.

Polarity of the one or more electrical bias signals 122, 124, for example, can be switched when controlling the acceleration/deceleration and bending of the ion beam 104. For example, when stepping through various different electrical bias signals 122 supplied to the acceleration/deceleration electrodes 128, different energies can be attained in the variable energy ion beam 116. Similarly, the electrical bias signal 124 (e.g., a bend voltage) applied to the one or more bend electrodes 130 can be varied to either maintain an angular relationship as constant between the variable energy ion beam 116 and the workpiece 108 as the energy of the variable energy ion beam is varied. Further, the angular relationship between the variable energy ion beam 116 and the workpiece 108 can be varied as the energy of the variable energy ion beam is varied via the control of the electrical bias signal 124.

Figure 1B:
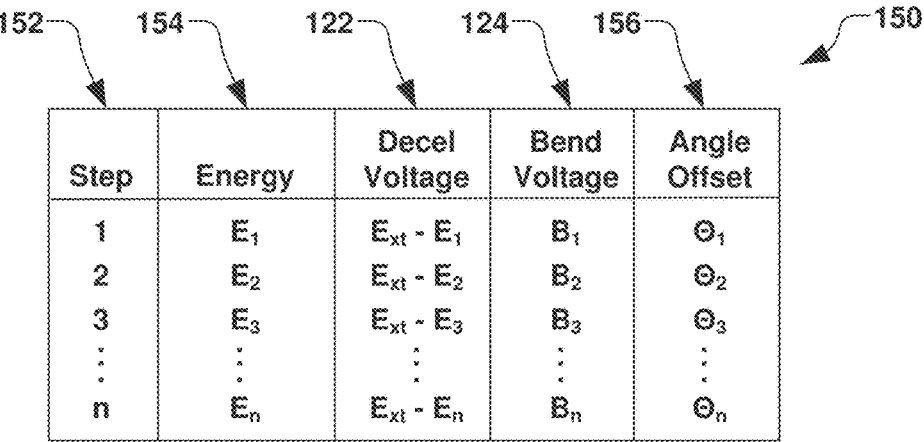
FIG. 1B is a chart illustrating various steps for implanting ions at various energies (e.g., an energy chain implant) in an ion implantation process in accordance with several aspects of the present disclosure.

FIG. 1B, for example, is a table 150 illustrating a plurality of energy steps 152 associated with a plurality of implantation energies 154. The table 150 further illustrates the respective electrical bias signals 122, 124 supplied to the acceleration/deceleration electrodes 128 and one or more bend electrodes 130, of FIG. 1A, whereby an accompanying angular offset 156 is further attained. Accordingly, the system 100 of FIG. 1A is configured to provide or induce the variable energy ion beam 116 having the various energies 154 and angular offsets 156 shown in FIG. 1B when concurrent with implantation into the workpiece 108 positioned on the workpiece support 110 in the end station 112, whereby the workpiece is continuously exposed to the ion beam and not removed from the chuck.

Figure 1C:
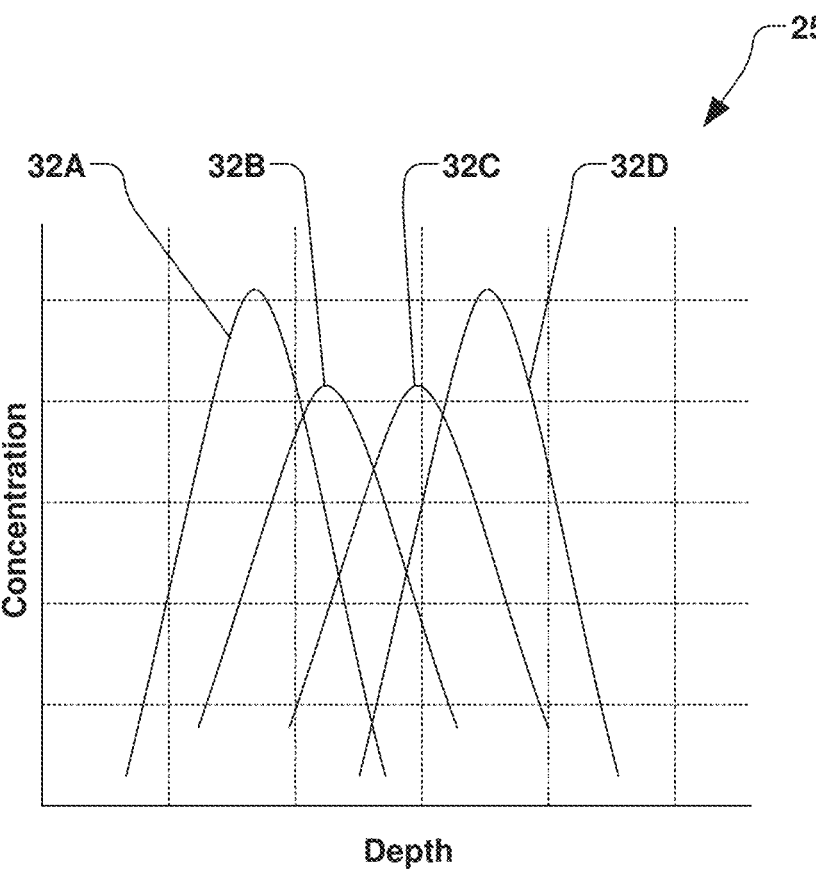
FIG. 1C illustrates several graphs showing an optimization of a profile of an ion implantation.

The table 150 of FIG. 1B, for example, can comprise any number n of energy E steps, such $E_1, E_2, E_3 \ldots E_n$, whereby various effects on the energy of the ions to be implanted can be achieved on the workpiece. For example, a large number of ion energy implants of different energies or process recipes can be efficiently and effectively provided over a number of passes of the workpiece 108 in front of the variable energy ion beam 116 to produce a blended, substantially uniform, or so called "box-like" dopant energy distribution 160 as illustrated in the example shown in FIG. 1C. Accordingly, a unique profile or shape associated with the plurality of process recipes is attainable, as illustrated in FIG. 1C, which depicts ion concentration (e.g., dose) and ion depth (e.g., a function of energy), referred to as an implant profile, which can be selectively varied with each implant step in the chain.

To accomplish this, the acceleration or deceleration of the ion beam 104 of FIG. 1A by the one or more acceleration/deceleration electrodes 128 and any angular deflection by the one or more bend electrodes 130 can be controlled and synchronized to vary the ion beam energy and/or beam angle while maintaining the workpiece 108 in the end station 112, wherein the workpiece is presented in front of, and continuously exposed to, the variable energy ion beam 116 as the workpiece remains on the workpiece support 110.

Figure 2:
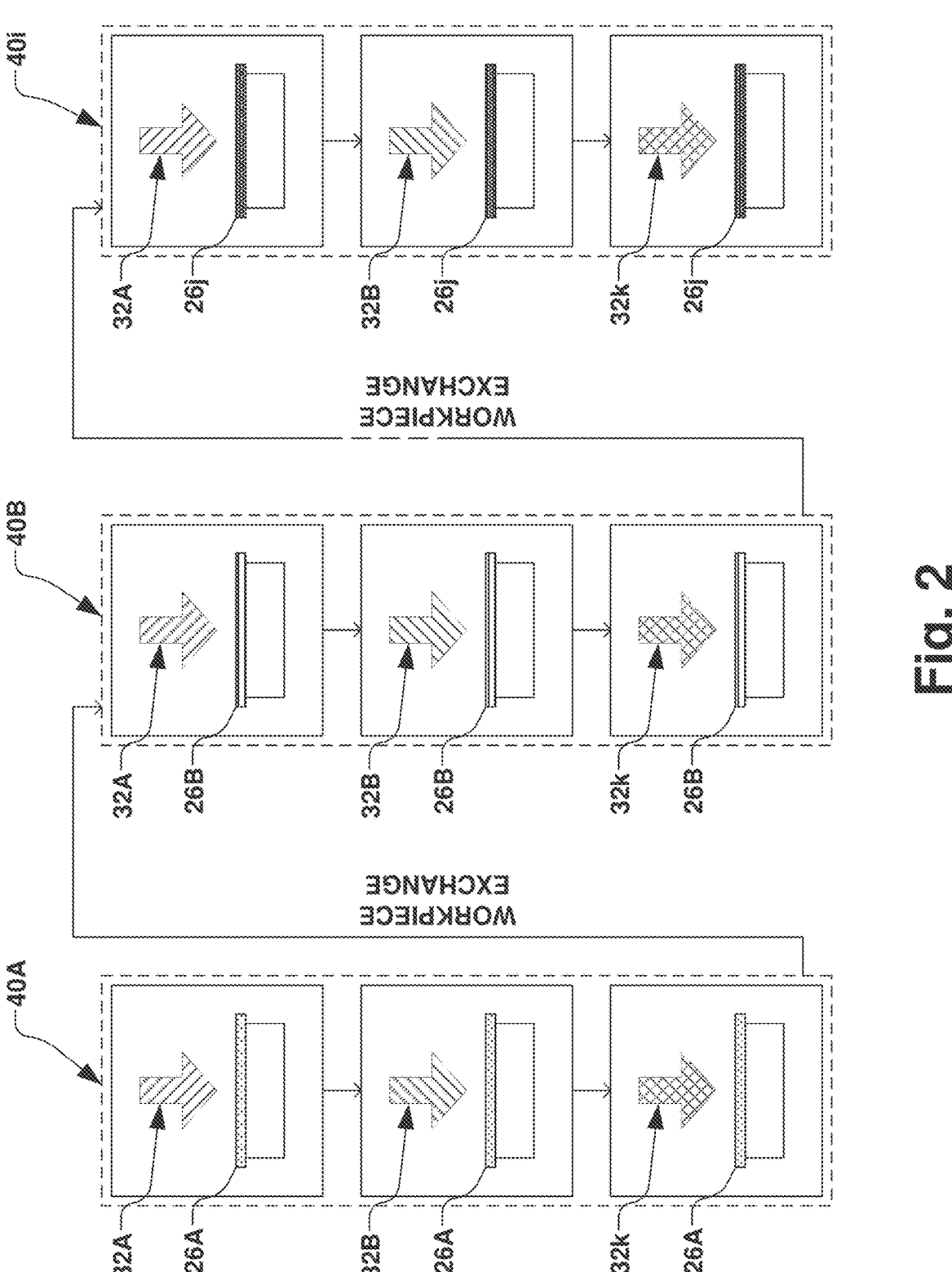
FIG. 2 illustrates an example of a process flow wherein a workpiece is implanted to receive complete multiple implant steps in a single workpiece ion implantation system.

The systems and methods of the present disclosure thus provide for a chaining of ion implant passes of multiple energy conditions over the workpiece 108 based on a process recipe. In one example embodiment illustrated in FIG. 2, a plurality of process recipes (e.g., a plurality of energies, doses, etc.) can be provided prior to initiating an implantation cycle comprising a plurality of implant passes, whereby the workpiece is not removed from the workpiece support (e.g., an ESC) when changing between the plurality of process recipes, as. For example, any number i of implant cycles 40A, 40B . . . 40i can be provided, whereby any number j of workpieces 26A, 26B . . . 26j are respectively implanted with any number k of process recipes 32A, 32B . . . 32*k*. As such, the workpieces 26 are maintained on the workpiece support for each change in process recipe 32 (e.g., changes of energies, doses, etc.) prior to be exchanged 42 for the next workpiece to be implanted with the energy distribution 30 of FIG. 1C, for example.

Further, the present disclosure provides for pre-tuning of the ion implantation system for the plurality of recipes prior to implant. For example, various components of the ion implantation system can be advantageously pre-tuned for all of the plurality of recipes for a given workpiece prior to commencement of the implant, whereby each of the plurality of recipes can be selectively and sequentially implemented to produce ion beams of different characteristics such as energy, angle and/or dose for implantation into the workpiece in a single and continuous implant cycle made up of a chain of implant steps implemented by ion beams of different characteristics. The present disclosure thus further provides a process for ion implantation of a single workpiece with a plurality of sequential implant steps at different energies using a single tuning recipe, whereby the single tuning recipe includes or encompasses any or all of the plurality of recipes.

The present disclosure thus provides productivity advantages over conventional ion implantation systems by removing workpiece exchange time and beam setup time and enabling implantation of multiple energies without having to retune the beam, block the beam from being implanted by the beam, or move the wafer from and back to the end station.

The present disclosure further provides all the energies of the beam across the entirety of the workpiece that is scanned, thus uniformly doping the entire workpiece with ions at any number of different energies. For example, a respective voltage controls a single downstream acceleration/deceleration apparatus (e.g., also referred to as an accel/decel apparatus) and a bending apparatus (e.g., also referred to as a bend apparatus) of the beam.

The present disclosure, for example, is directed generally toward a system, apparatus, and method for varying an energy of an ion beam delivered to a workpiece in an ion implantation system while maintaining the workpiece on a workpiece support and continuously exposing the workpiece to the ion beam as the energy thereof is varied. In one particular embodiment, the system, apparatus, and method for varying the energy of the ion beam is disclosed in conjunction with a scanned pencil beam system architecture of the type developed, manufactured and sold by Axcelis Technologies, Inc. of Beverly, MA. However, it is also contemplated that the present disclosure can be implemented in commonly known ribbon beam or pencil beam ion implantation system architectures, as are well known in the field of ion implantation and will be further described.

Thus, the present disclosure is applicable to, and is contemplated for implementation in, various ion implanters. For example, the present disclosure is applicable to three types of ion implanters: those wherein a ribbon-shaped ion beam is defined and transported though a beamline, the ribbon-shaped ion beam having a lengthwise dimension greater than a width of the workpiece being irradiated with the ion beam; those that employ an ion beam that has a relatively static cross-sectional dimension and in which the workpiece is moved relative to the ion beam in two dimensions; and those that employ a hybrid system in which the ion beam is oscillated or scanned along a first direction relative to the workpiece and the workpiece is moved along a second direction that is transverse to the first direction.

Likewise, the present invention is equally applicable to ion implanters that enable high current implant capabilities, low-dose implant capabilities and high energy implant capabilities, including tandem and/or RF linear accelerator-based systems.

The present disclosure further incorporates by reference the contents of co-owned U.S. Pat. Nos. 9,218,941 and 7,550,751 in their entireties, herein.

The disclosed selectively variable control of energy distribution in the ion implantation process while maintaining a workpiece on a support or platen in a processing chamber and/or continuously exposing the workpiece to the ion beam has not been heretofore disclosed or contemplated. Thus, the present disclosure provides a system, apparatus, and method for varying an energy distribution of ions implanted by an ion beam across the workpiece while the workpiece is maintained on the platen in the process chamber.

It will be understood that the foregoing application is but one of various processes and applications that are enabled by the variable energy/depth ion implantation system and method of the present disclosure. The disclosure and claim scope is not limited to the solution for this problem, nor is it limited to a process for providing variable depth implants in a convex shape, a concave shape or any other shape or other contour of the workpiece. Such a variable, across-workpiece non-uniform ion energy implantation process of the present disclosure can be implemented in any manner as desired to provide a substantially continuously variable implant depth contour, in addition to a non-continuous variable implant depth contour. For example, it is contemplated that the present disclosure can be utilized in any desired application wherein selectively variable ion implantation depths (e.g., across the workpiece) are desired via selective variation of ion implant energy. There can be a number of reasons to implant at different depths/energies across the surface of a workpiece, including but not limited to: variation of threshold voltages across the workpiece; systematic profile changes in energy profile of the implant across the scan width of the workpiece; and the ability to implant multiple dies of different electrical characteristics on a single wafer.

Thus, to the accomplishment of the foregoing and related ends, the invention comprises the features hereinafter fully described and particularly pointed out in the claims. The following description and the annexed drawings set forth in detail certain illustrative embodiments of the invention. These embodiments are indicative, however, of but a few of the various ways in which the principles of the invention may be employed. Other objects, advantages and novel features of the invention will become apparent from the following detailed description of the invention when considered in conjunction with the drawings.

Accordingly, the present invention will now be described with reference to the drawings, wherein like reference numerals may be used to refer to like elements throughout. It should be understood that the description of these aspects are merely illustrative and that they should not be interpreted in a limiting sense. In the following description, for purposes of explanation, numerous specific details are set forth in order to provide a thorough understanding of the present invention. It will be evident to one skilled in the art, however, that the present invention may be practiced with or without these specific details.

Figure 3:
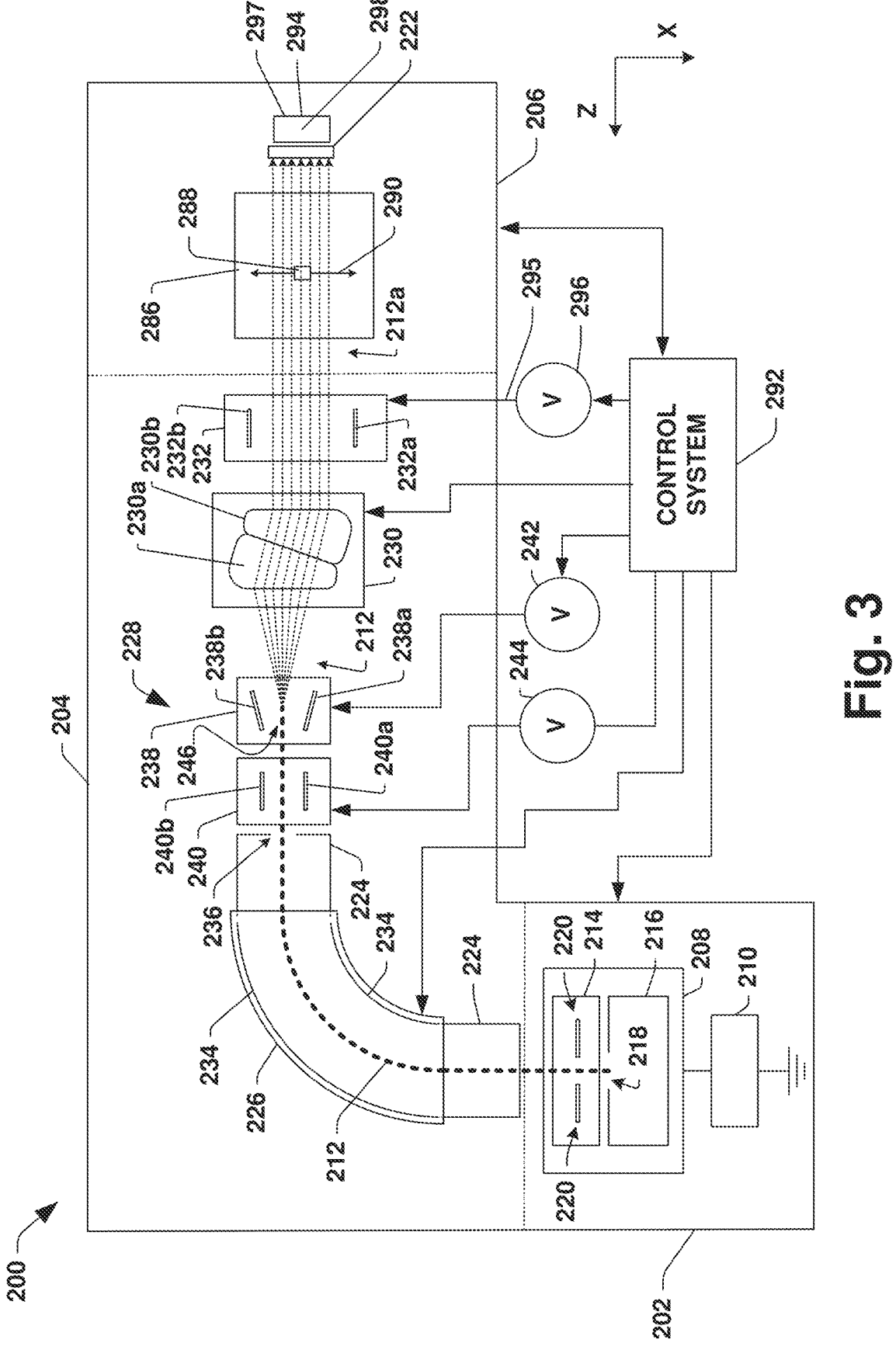
FIG. 3 is a schematic block diagram of an example ion implantation system in accordance with several aspects of the present disclosure.

FIG. 3 illustrates an exemplary ion implantation system 200 wherein ion beam energy can be selectively varied and/or controlled as described herein. The system 200 has a terminal 202, a beamline assembly 204, and an end station

206. The terminal 202 includes an ion source 208 powered by a high voltage power supply 210 that produces and directs an ion beam 212 to the beamline assembly 204. In this regard, the ion source 208 generates charged ions that are extracted from the source via an extraction assembly 214 and formed into the ion beam 212 that is subsequently directed along a beam path in the beamline assembly 204 to the end station 206.

To generate the ions, a dopant material (not shown) to be ionized is provided within a generation chamber 216 of the ion source 208. The dopant material, for example, can be fed into the chamber 216 from a gas source (not shown). In one example, in addition to power supply 210, it will be appreciated that any number of suitable mechanisms (not shown) can be used to excite free electrons within the ion generation chamber 216, such as RF or microwave excitation sources, electron beam injection sources, electromagnetic sources and/or a cathode which creates an arc discharge within the chamber. The excited electrons collide with the dopant gas molecules, thereby generating ions. Generally, positive ions are generated, although the disclosure herein is also applicable to systems wherein negative ions are generated.

The ions are controllably extracted through a slit 218 in the chamber 216 by an ion extraction assembly 214, wherein the ion extraction assembly comprises a plurality of extraction and/or suppression electrodes 220. The ion extraction assembly 214, for example, can include a separate extraction power supply (not shown) to bias the extraction and/or suppression electrodes 220 for accelerating the ions extracted from the generation chamber 216. It can be appreciated that since the ion beam 212 comprises like-charged particles, the ion beam may have a tendency to expand radially outwardly, or beam "blow up", as the like-charged particles repel one another within the ion beam. It can also be appreciated that this phenomenon of beam blow-up can be exacerbated in low energy, high current (e.g., high perveance) beams, where many like-charged particles are moving in the same direction relatively slowly, and wherein there is an abundance of repulsive forces among the particles, but little particle momentum to keep the particles moving in the direction of the beam path.

Accordingly, the extraction assembly 214 is generally configured such that the ion beam 212 is extracted at a high energy so that the ion beam does not blow up (e.g., so that the particles have sufficient momentum to overcome repulsive forces that can lead to beam blow up). Moreover, it is generally advantageous to transfer the beam 212 at a relatively high energy throughout the system, wherein this energy can be reduced as desired just prior to implantation of the ions into the workpiece 222 to promote beam containment. It can also be advantageous to generate and transport molecular or cluster ions, which can be transported at a relatively high energy but are implanted with a lower equivalent energy, since the energy of the molecule or cluster is divided amongst the dopant atoms of the molecule.

In the exemplary ion implantation system depicted in FIG. 3, the beamline assembly 204 includes a beamguide 224, a mass analyzer 226, a scanning system 228, a parallelizer 230, and one or more acceleration or deceleration and/or filtering subsystems 232. The mass analyzer 226 is configured to have approximately a ninety-degree angle and comprises one or more magnets (not shown) that serve to establish a (dipole) magnetic field therein. As the ion beam 212 enters the mass analyzer 226, it is correspondingly bent by the magnetic field such that desired ions are transported down the beam path, while ions of an inappropriate charge-to-mass ratio are rejected. More particularly, ions having too great or too small a charge-to-mass ratio are deflected either insufficiently or exceedingly so as to be steered into side walls 234 of the mass analyzer 226 so that the mass analyzer allows those ions in the beam 212 that have the desired charge-to-mass ratio to pass there-through and exit through a resolving aperture 236.

A scanning system 228 is further illustrated, wherein the scanning system, for example, comprises a scanning element 238 and a focusing and/or steering element 240. The scanning system 228 can comprise various known scanning systems, such as demonstrated in U.S. Pat. No. 4,980,562 to Berrian et al.; U.S. Pat. No. 5,091,655 to Dykstra et al.; U.S. Pat. No. 5,393,984 to Glavish; U.S. Pat. No. 7,550,751 to Benveniste et al.; and U.S. Pat. No. 7,615,763 to Vanderberg et al., the entirety of which are hereby incorporated herein by reference.

In the exemplary scanning system 228, respective power supplies 242, 244 are operatively coupled to a scanning element 238 and a focusing and steering element 240, and more particularly to respective electrodes 238a, 238b and 240a, 240b located therein. The focusing and steering element 240 receives the mass analyzed ion beam 212 having a relatively narrow profile (e.g., a "pencil" or "spot" beam in the illustrated system 200), wherein a voltage applied by the power supply 244 to the plates 240a and 240b operates to focus and steer the ion beam to an optimal point, preferably a scan vertex 246, of the scanning element 238. A voltage waveform applied by the power supply 242 (e.g., the power supply 244 can also serve as the power supply 242) to the scanner plates 238a and 238b then scans the beam 212 back and forth to spread the beam 212 out into an elongated scanned or ribbon-shaped beam (e.g., a scanned beam 212), having a width or lengthwise dimension in the x-axis that may be at least as wide as or wider than the workpieces of interest. It will be appreciated that the scan vertex 246 can be defined as the point in the optical path from which each beamlet or scanned part of the ribbon beam appears to originate after having been scanned by the scanning element 238.

It will be understood that an ion implantation system of the type described herein may employ different types of scanning systems. For example, electrostatic systems or magnetic systems could be employed in the present invention. A typical embodiment of an electrostatic scanning system includes a power supply coupled to scanner plates or electrodes 238a and 238b, where the scanner 238 provides a scanned beam. The scanner 238 receives the mass analyzed ion beam having a relatively narrow profile (e.g., a "pencil" beam in the illustrated system), and a voltage waveform applied by the power supply 242 to the scanner plates 238a and 238b operates to scan the beam back and forth in the X direction (the scan direction) to spread the beam out into an elongated ribbon-shaped beam (e.g., a scanned beam), having an effective X-direction width that may be at least as wide as or wider than the workpieces of interest. Similarly, in a magnetic scanning system, a high current supply is connected to the coils of an electromagnet. The magnetic field is adjusted to scan the beam. For purposes of this disclosure, all different types of scanning systems are contemplated, and the electrostatic system described herein is used for illustration purposes only.

The scanned beam 212 is subsequently passed through the parallelizer 230. Various parallelizer systems 230 are demonstrated by U.S. Pat. No. 5,091,655 to Dykstra et al.; U.S. Pat. No. 5,177,366 to Dykstra et al.; U.S. Pat. No. 6,744,377 to Inoue; U.S. Pat. No. 7,112,809 to Rathmell et al.; and U.S. Pat. No. 7,507,978 to Vanderberg et al., the entirety of which are hereby incorporated herein by reference. As the name implies, the parallelizer 230 causes the incoming scanned pencil beam having divergent rays or beamlets to be deflected into parallel rays or beamlets 212a so that implantation parameters (e.g., implant angles) are uniform across the workpiece 222. In the presently illustrated embodiment, the parallelizer 230 comprises two dipole magnets 230a, 230b, wherein the dipoles are substantially trapezoidal and are oriented to mirror one another to cause the beam 212 to bend into a substantially "s-shape". In a preferred embodiment, the dipoles have equal angles and opposite bend directions.

The primary purpose of the dipoles is to convert a plurality of divergent rays or beamlets originating from the scan vertex 246 into a plurality of substantially parallel rays or beamlets having the form of a relatively thin, elongated ribbon shaped beam. The use of two symmetric dipoles, as illustrated herein, results in symmetrical properties across the ribbon shaped beam in terms of beamlet path length and first and higher order focusing properties. Furthermore, similar to the operation of the mass analyzer 226, the s-shaped bend serves to filter and decontaminate the ion beam 212. In particular, the trajectories of neutral particles and/or other contaminants (e.g., environmental particles) that enter the ion beam 212 downstream of the mass analyzer 226 are not generally affected by (or are affected very little by) the dipoles, such that these particles continue traveling along the original beam path, whereby a relatively large quantity of these neutral particles that do not get bent or get bent very little thus do not impact the workpiece 222 (e.g., the workpiece is positioned to receive the bent ion beam 212). It can be appreciated that it is important to remove such contaminants from the ion beam 212 as they may possess an incorrect charge, and/or energies etc. Generally, such contaminants would not be affected (or are affected to a much lesser degree) by deceleration and/or other stages in the system 200. As such, they can have a significant (albeit unintended and generally undesirable) impact upon the workpiece 222 in terms of dose, energy and angle uniformity. This can, in turn, produce unanticipated and undesirable resultant device performance.

Downstream of the parallelization component 230, one or more deceleration stages 232 are provided. Examples of deceleration and/or acceleration systems are demonstrated by U.S. Pat. No. 5,091,655 to Dykstra et al. U.S. Pat. No. 6,441,382 to Huang and U.S. Pat. No. 8,124,946 to Farley et al., the entirety of which are hereby incorporated herein by reference. As previously indicated, up to this point in the system 200, the beam 212 is generally transported at a relatively high energy level to mitigate the propensity for beam blow-up, which can be particularly high where beam density is elevated such as at a resolving aperture 236, for example. Similar to the ion extraction assembly 214, scanning element 238 and focusing and steering element 240, the deceleration stage 232 comprises one or more electrodes 232a, 232b operable to decelerate the beam 212.

It will be appreciated that while two electrodes 220a and 220b, 238a and 238b, 240a and 240b and 232a and 232b are respectively illustrated in the exemplary ion extraction assembly 214, scanning element 238, focusing and steering element 240 and deceleration stage 232, these elements 214, 238, 240 and 232 may comprise any suitable number of electrodes arranged and biased to accelerate and/or decelerate ions, as well as to focus, bend, deflect, converge, diverge, scan, parallelize and/or decontaminate the ion beam 212 such as provided in U.S. Pat. No. 6,777,696 to Rathmell et al., the entirety of which is hereby incorporated herein by reference. Additionally, the focusing and steering element 240 may comprise electrostatic deflection plates (e.g., one or more pairs thereof), as well as an Einzel lens, quadrupoles and/or other focusing elements to focus the ion beam. Although not necessary, it can be advantageous to apply voltages to the deflecting plates within the steering and focusing element 240 so that they average to zero, the effect of which is to avoid having to introduce an additional Einzel lens to mitigate the distortion of the focusing aspect of element 240. It will be appreciated that "steering" the ion beam 212 is a function of the dimensions of plates 240a, 240b and the steering voltages applied thereto, among other things, as the beam direction is proportional to the steering voltages and the length of the plates, and inversely proportional to the beam energy.

It will also be appreciated that while the electrodes of the ion extraction assembly 214, scanning element 238, focus and steering element 240, and/or other optical elements (not shown) that may be incorporated along the beam path may be utilized to accelerate or decelerate the ion beam and provide selectively variable ion beam energy in accordance with the present invention, using these upstream assemblies and/or elements to vary the ion beam energy will typically induce adjustment and retuning of other downstream components, resulting in the problems discussed herein that have previously inhibited the practice and implementation of efficient and effective chained energy ion implantation in production environments. However, the sole use of a downstream deceleration (or acceleration stage) 232, as depicted in the exemplary beamline depicted in FIG. 3, advantageously allows for avoiding such problematic adjustment and retuning of other downstream components, which enables the practice and implementation of efficient and effective chained energy ion implantation in production environments.

The chained energy ion implantation can be most advantageously implemented wherein: (1) the ion implantation system architecture includes a single wafer end station architecture such that a single wafer can be maintained on a wafer support throughout the selective variation of the ion beam energy; (2) the system incorporates hardware for enabling high or low temperature implants such that the temperature of the wafer can be maintained at a substantially constant elevated or decreased temperature throughout the variable energy ion implantation process; and/or (3) the wafer is continuously exposed to the selectively variable energy ion beam without the requirement to move the wafer out of the beam path or block the beam from impacting the wafer while adjustment and retuning of downstream components is carried out to sequentially deliver variable energy ion beams to the wafer.

Figure 4:
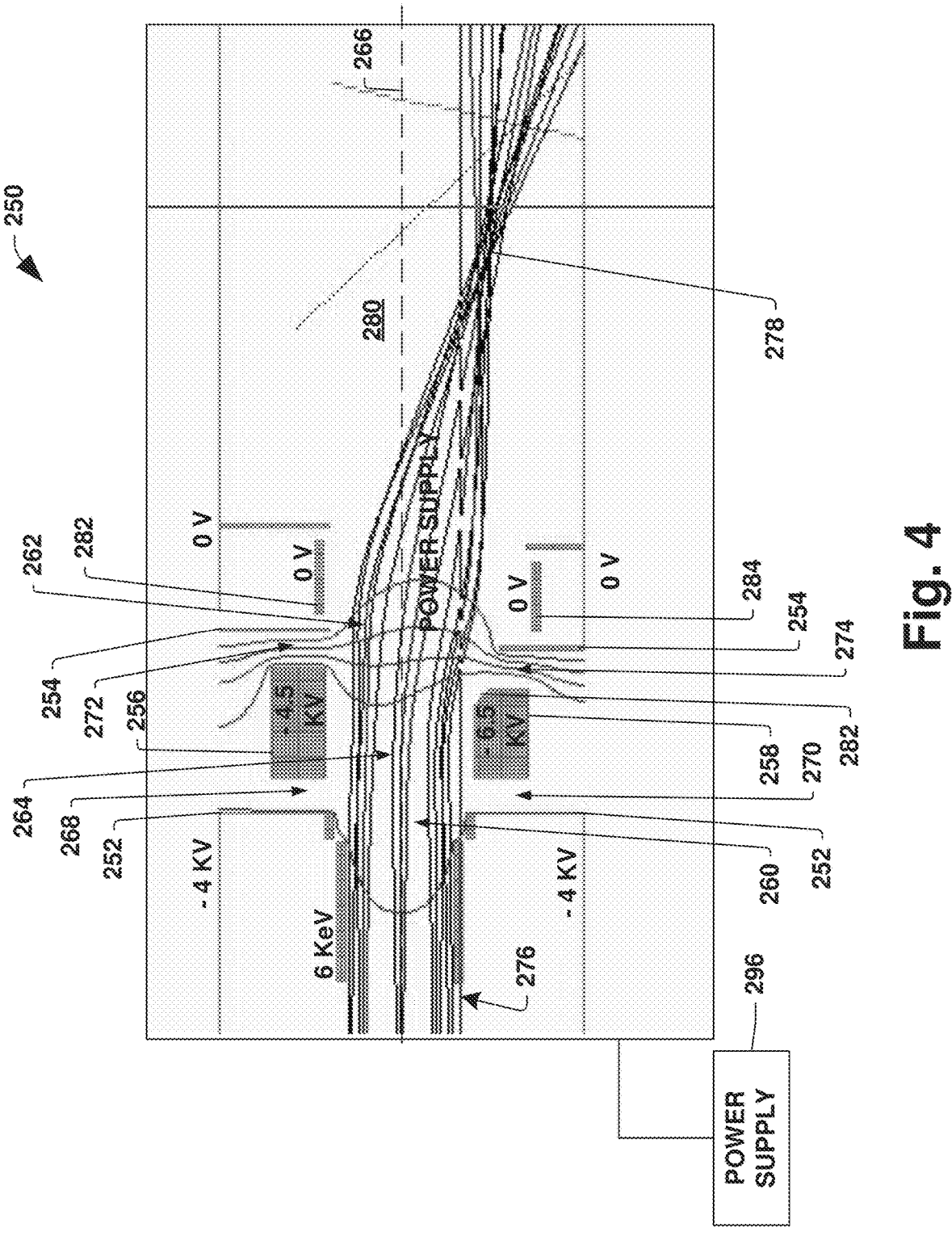
FIG. 4 illustrates a portion of an ion beam in an exemplary acceleration/deceleration column of an ion implantation system in accordance with several aspects of the present disclosure.

FIG. 4 illustrates an exemplary acceleration/deceleration stage 232 in accordance with one or more aspects of the present disclosure is illustrated in greater detail as an electrode column 250, which includes first and second electrodes 252 and 254 and a pair of intermediate electrode plates 256 and 258. The first and second electrodes 252 and 254 are substantially parallel to one another and define first and second apertures 260 and 262, respectively. A gap 264 is defined between the apertures 260, 262 and the electrodes 252, 254 are arranged such that an axis 266 substantially normal to the first and second electrodes 252, 254 runs through the gap 264 and through the first and second apertures 260, 262. The intermediate electrode plates comprise an upper mid-gap electrode 256 and a lower mid-gap electrode 258. A first upper sub-gap area 268 is defined between the first electrode 252 and the upper mid-gap electrode 256. A first lower sub-gap area 270 is defined between the first electrode 252 and the lower mid-gap electrode 258. Similarly, a second upper sub-gap area 272 is defined between the second electrode 254 and the upper mid-gap electrode 256, and a second lower sub-gap area 274 is defined between the second electrode 254 and the lower mid-gap electrode 258. An ion beam 276 passes through the gap 264 and is deflected from the axis 266, such as by about 12 degrees, for example, and is focused at a point 278 downstream from the gap 264. The present disclosure further incorporates by reference the contents of co-owned U.S. Pat. No. 9,218,941 to Jen et al. in its entirety, herein.

In the illustrated example, particular biases are depicted to facilitate a discussion of the operation of the electrode column 250 that make up the exemplary acceleration/deceleration 232. It will be appreciated, however, that, for purposes of the present disclosure, any suitable electrical biases may be applied among the electrodes to achieve desired results (e.g., a degree of acceleration, deceleration, and/or deflection). Indeed, in the context of the present disclosure wherein variable ion beam energy is the desired result, it will be understood that variation of the electrical bias signals applied to these electrodes will be present, whether this involves variations to voltages applied to the electrodes or currents therethrough. The bias values in FIG. 4 are, however, effective to demonstrate deceleration of the ion beam 276.

The ion beam 276, and more particularly the positive ions contained therein, enter the gap 264 through the first aperture 260 with an initial energy level (e.g., 6 KeV in the example illustrated). In order to accelerate or decelerate the ions in the beam, the first and second electrodes 252 and 254 are biased differently so that a difference in potential exists therebetween and the ions experience a corresponding increase or decrease in energy as they pass through the gap 264 between the first and second electrodes 252, 254. For instance, in the example presented in FIG. 4, the positive ions of the ion beam experience an energy drop of 4 KeV as they pass from the first electrode 252 which has a negative 4 KV bias to the second electrode 254 which has zero potential (e.g., is coupled to ground). Thus, the original ion beam energy of positive 6 KeV is reduced to 2 KeV as the ions pass through the gap 264 and experience a 4 KeV energy drop. The ion beam 276 will therefore have a particular resulting energy level (e.g., 2 KeV in the example illustrated) once it exits the gap 264 and enters a neutral zone 280 downstream from the gap 264.

It will be appreciated that this is true regardless of the path the ions may have taken to get through the gap 264. For instance, in the example illustrated, ions entering the lower sub-gap 270 between the first electrode 252 and the lower mid-gap electrode 258 will be accelerated at a rate greater than the rate at which ions entering the upper sub-gap 268 between the first electrode 252 and the upper mid-gap electrode 256 will be accelerated. This is because there is a greater difference in potential between the first electrode 252 and the lower mid-gap electrode 258 than there is between the first electrode 252 and the upper mid-gap electrode 256 (e.g., negative 2.5 KV for the lower sub-gap 270 (negative 4 KV minus negative 6.5 KV) and negative 0.5 KV for the upper sub-gap 268 (negative 4 KV minus negative 4.5 KV)).

This difference in acceleration is, however, offset by a corresponding difference in potential between the upper 256 and lower 258 mid-gap electrodes and the second electrode 254. For instance, in the example illustrated, the second electrode 254 is biased to zero (e.g., coupled to ground). Thus, the ions coming from the first lower sub-gap 270 are decelerated to a greater degree than the ions coming from the first upper sub-gap 268. This offsets the differences in acceleration of the ions as they enter the gap such that as the ions exit the gap they all possess substantially the same energy (e.g., 2 KeV). The ions coming from the first lower sub-gap 270 will be decelerated to a greater degree because they will have to traverse the negative 6.5 KV while crossing the second lower sub-gap 274 (e.g., the negative 6.5 KV bias of the lower mid-gap electrode 258 minus the zero V bias of the second electrode 254). By contrast, the ions coming from the first upper sub-gap 268 will be decelerated to a lesser degree because they will merely have to traverse the negative 4.5 KV while crossing the second upper sub-gap 272 (e.g., the negative 4.5 KV bias of the upper mid-gap electrode 256 minus the zero V bias of the second electrode 254). Accordingly, regardless of the different paths the ions take and the energy levels through which the ions pass, substantially all of the ions emerge from the effects of the gap at substantially the same energy level (e.g., 2 KeV).

It will be appreciated that the upper and lower mid-gap electrodes 256, 258 serve the dual purpose of pulling the ion beam into the gap 264 to accelerate or decelerate the ion beam, and to provide beam deflection or bending for beam filtering purposes. For example, the mid-gap plates 256, 258 are generally differentially biased relative to one another so that an electrostatic field is developed therebetween to bend or deflect the beam either up or down, or with varying magnitude, depending upon the magnitude of the biasing of the electrodes and relative to the energy of the ion beam. In the example featured, for instance, the upper and lower mid-gap electrodes 256, 258 are biased to negative 4.5 KV and negative 6.5 KV, respectively. Presuming the beam comprises positively charged ions, this difference in potential causes the positively charged ions passing through the gap 264 to be forced downward toward the more negatively charged lower mid-gap electrode 258, ultimately causing the beam 276 to bend or deflect downward (e.g., by about 12 degrees). Bending or deflecting the ions in this manner has the effect of filtering neutral particles from the beam, which are not influenced by the electric field through which the ion beam passes, and also filtering ions that are may not be at substantially the same energy as the ions to be implanted.

It will be understood that in order to maintain this exemplary 12 degree deflection in view of a varying energy beam, the bias applied to the mid-gap electrodes 256, 258 must also be varied in a corresponding manner. For example, acceleration of an ion beam can be induced by biasing electrodes 282, 284 to negative 4 KV while biasing electrodes 252, 254 to positive 40 KV, although any biasing value(s) are contemplated. This biasing arrangement creates a negative potential barrier which extends out into the neutral zone. It will be appreciated that with these bias voltages applied the operation of the device is substantially similar to that described, with the exception that the beam 276 is accelerated rather than decelerated. These exemplary values serve to increase the energy level of the beam from, for example 80 KeV to 120 KeV, accelerating the beam by a factor of 1.5, wherein positive ions in the beam 276 will be accelerated as the ions traverse the second upper sub-gap area 272 and the second lower sub-gap area 274.

It will be appreciated that the arrangement, configuration and/or shaping of the upper 256 and lower 258 mid-gap electrodes can be tailored to facilitate control over the lensing, focusing, deflection and/or acceleration/deceleration effect on the beam. By way of example, in the illustration depicted in FIG. 4, the lower mid-gap electrode 258 has a slightly reduced width relative to that of the upper mid-gap electrode 256 and also possesses a slightly beveled corner 282. These adjustments essentially counter the increased lensing effects that the ions near the lower mid-gap electrode 258 experience as they undergo stronger acceleration and/or deceleration due to differences in applied biases. It will be appreciated, however, that for purposes of the present disclosure these electrodes 256, 258 can have any suitable configurations, including identical shapes. It will be further appreciated that the beam may or may not be bent or deflected in acceleration, deceleration and/or drift (e.g., zero accel/decel) modes because the upper and lower mid-gap electrodes 256, 258, which are predominately responsible for beam bending, operate substantially independently of the first and second electrodes 252, 254, which are predominantly responsible for the acceleration/deceleration of the beam 276. For example, the upper and lower mid-gap electrodes can be biased to identical voltages such that acceleration or deceleration can be induced without bending the ion beam 276.

The overall net effect of all of the differences in potential is focusing, deceleration (or acceleration) and optional deflecting of ions in the beam 276. Deflection of the ion beam provides energy decontamination as neutral particles in the beam, which are undeterred by the effects of the electrodes, continue along the original beam path parallel to the axis 266. The contaminants may then, for example, encounter some type of barrier or absorbing structure (not shown), which halts their forward progress and shields any workpiece from the contaminants. By contrast, the trajectory of the deflected ion beam 276 causes the beam to appropriately encounter and dope select areas of the workpiece (not shown).

It will be appreciated that the arrangement of the electrodes (e.g., the upper and lower mid-gap electrodes 256, 258 intermediate the first and second electrodes 252, 254) also serves to mitigate beam blow up as this configuration minimizes the distance the beam 276 has to travel before encountering the wafer. By having the beam 276 be accelerated, decelerated, or deflected (e.g., by the upper and lower mid-gap electrodes 256, 258) while concurrently having the beam be focused (e.g., by the first and second electrodes 252, 254), rather than having these bending and focusing stages arranged serially, the end station can be situated closer to the accelerator/decelerator stage of the ion implantation system.

In the illustrated example(s), particular electrical biases are applied to electrodes and are depicted to facilitate a better understanding of the operation of the deceleration stage 232 of FIG. 3. It will be appreciated, however, that, for purposes of the present disclosure, any suitable biases may be applied among the electrodes to achieve desired results, such as degree of acceleration, deceleration, and/or deflection, if any. In addition, for the purposes of the present disclosure, magnets and electrical currents therethrough may be utilized to achieve these desired results. Moreover, the particular biases are applied in a selectively variable and controlled manner in order to achieve the selective and variable energy control of the present disclosure. The illustrated bias values in FIG. 4 are, however, effective to demonstrate deceleration of the ion beam 276.

It should be noted that the selective variation of the bias voltage can be further based on one or more predetermined characteristics provided by one of an operator and a characterization of the workpiece 222 of FIG. 3, for example, and can be iterative. For example, a "chain implant" can be performed, wherein a discrete number of implants having variable doses or energies (e.g., a plurality of sequential implants making up a "chain") are provided to the workpiece 222 in either a predetermined sequential order, or in a randomized manner. The predetermined sequential order of the chain implant, for example, can begin at a low energy and sequence through a set of predetermined energies in a specific order from the low energy to a high energy. In another example, the predetermined sequential order of the chain implant can begin at a high energy and sequence through a set of predetermined energies in a specific order from the high energy to a low energy. In yet another example, the chain implant can begin at any given energy and sequence through a set of predetermined energies in any specified or randomized order. Each "chain", for example, can be predetermined through a metrology map of the workpiece 222 prior to implantation. In addition, each step of the chain can be programmed into the control system of the ion implanter as a plurality of sequential steps prior to initiation of the implant chain.

Thus, the overall effect is a controlled variable doping depth profile across the workpiece 222 that is either uniform or non-uniform, as desired, thus defining an energy patterned implant. For example, chains of differing energies may be iteratively performed, wherein the dose and doping depth profile across the workpiece provided in each step of the chain results in a substantially uniform implant profile. Alternatively, topographic feedback can be utilized to selectively vary the bias voltage concurrent with the selective variation of implantation implant energy and/or between sequential implants making up the chain.

It shall be appreciated that different types of end stations 206 may be employed in the implanter system 200. For example, a "batch" type end station can simultaneously support multiple workpieces 222 on a rotating support structure, wherein the workpieces 222 are rotated through the path of the ion beam until all the workpieces are completely implanted. A "serial" type end station, on the other hand, supports a single workpiece 222 along the beam path for implantation, wherein multiple workpieces 222 are implanted one at a time in serial fashion, with each workpiece 222 being completely implanted before implantation of the next workpiece 222 begins. In hybrid systems the workpiece 222 may be mechanically translated in a first (Y or slow scan) direction while the beam is electrically or magnetically scanned in a second (X or fast scan) direction to impart the beam 212 over the entire workpiece 222, as disclosed, for example, in commonly assigned U.S. Pat. No. 9,443,698, incorporated in its entirety by reference herein. By contrast, in a so-called two-dimensional mechanical scan architecture as is known in the art and exemplified by the Optima HD™ Ion Implantation System manufactured and sold by Axcelis Technologies, Inc. of Beverly, MA, the workpiece 222 may be mechanically translated in front of a fixed position ion beam, in a first (slow) scan direction while the workpiece is simultaneously scanned in a second, substantially orthogonal, (fast) scan direction to impart the beam 212 over the entire workpiece 222. In addition, in a so-called ribbon beam system, the ion beam can be transported along the beamline in a manner such that the beam has a lengthwise dimension that that is greater than the workpiece such that only the workpiece is scanned in a direction transverse to the lengthwise dimension of the beam for implanting ion across the entire surface of the workpiece.

The end station 206 in the illustrated example is a "serial" type end station that supports a single workpiece 222 along the beam path for implantation. A dosimetry system 286 is included in the end station 206 near the workpiece location for calibration measurements prior to implantation operations. During calibration, the beam 212 passes through dosimetry system 286. The dosimetry system 286 includes one or more profilers 288 that may continuously traverse a profiler path 290, thereby measuring the profile of the scanned beams. The profiler 288 may comprise a current density sensor, such as a Faraday cup, for example, that measures the current density of the scanned beam, where current density is a function of the angle of implantation (e.g., the relative orientation between the beam and the mechanical surface of the workpiece and/or the relative orientation between the beam and the crystalline lattice structure of the workpiece). The current density sensor moves in a generally orthogonal fashion relative to the scanned beam and thus typically traverses the width of the ribbon beam. The dosimetry system, in one example, measures both beam density distribution and angular distribution. Measurement of beam angles can use a moving profiler sensing current behind a mask with slots as described in the literature. The displacement of each individual beamlet from the slot position after a short drift can be used to calculate the beamlet angle. It will be appreciated that this displacement may be referred to as a calibrated reference of beam diagnostics in the system.

The dosimetry system 286 is operably coupled to a control system 292 to receive command signals therefrom and to provide measurement values thereto. For example, the control system 292, which may comprise a computer, microprocessor, etc., may be operable to take measurement values from the dosimetry system 286 and calculate an average angle distribution of the scanned ribbon beam across the workpiece. The control system 292 is likewise operatively coupled to the terminal 202 from which the beam of ions is generated, as well as the mass analyzer 226 of the beamline assembly 204, the scanning element 238 (e.g., via power supply 242), the focusing and steering element 240 (e.g., via power supply 244), the parallelizer 230 and the acceleration/deceleration stage 232. Accordingly, any of these elements can be adjusted by the control system 292 to facilitate desired ion implantation parameters based upon values provided by the dosimetry system 286 or any other ion beam measuring or monitoring device. Control signals can also be generated via look up tables that are stored into memory modules, typically based on empirical data collected through experimentation.

As one example, the ion beam can initially be established according to predetermined beam tuning parameters (e.g., stored/loaded into the control system 292). Then, based upon feedback from the dosimetry system 286, the scanner 238 can be adjusted to alter the scan speed of the scanned beam to vary the ion dose on the workpiece. Similarly, the acceleration/deceleration stage 232 and/or the ion extraction assembly can be adjusted to alter the energy level of the beam to adjust junction depths by adjusting the bias applied to electrodes in the ion extraction assembly 214 and/or the deceleration stage 232, for example. Correspondingly, the strength and orientation of magnetic or electric field(s) generated in the scanner can be adjusted, such as by regulating the electrical bias signals supplied to the scan electrodes, for example. The angle of implantation can be further controlled by adjusting the voltage applied to the steering element 240, or the acceleration/deceleration stage 232, for example.

In accordance with one aspect of the disclosure, a control system 292 is provided and configured to establish a predetermined scan pattern on the workpiece 222, wherein the workpiece is exposed to the spot ion or pencil beam by means of control of the scanning system 228. The control system 292, for example, is configured to control various properties of the ion beam, such as the beam density and current of the ion beam, as well as other properties associated with the ion beam, specifically energy thereof. Further, the controller 292 is configured to control a speed of scanning of the workpiece positioned on a workpiece support 294. While not shown, the workpiece support 294, for example, is operably coupled to a translation mechanism (e.g., a robotic apparatus or other apparatus) configured to translate the workpiece 222 residing on the workpiece support through the ion beam 212.

Further, in the context of the present disclosure for providing a continuously controlled variable energy ion beam in the ion implantation system 200, the control system 292 is configured to modify and adjust electrical bias signals 295 applied to various subsystems. For example, the control system 292 is configured to control electrical bias signals 295 supplied to the deceleration/acceleration stage 232 from one or more variable power sources 296, whereby an energy of the ion beam 212 in the ion implantation system is applied to the various of the electrodes illustrated herein.

With respect to the exemplary ion implantation system 200 described herein, the control system 292 can be configured to modify and vary the scan voltage applied to the scanner 228 and can be further configured to modify and vary, in synchronism with the scan voltage, the bias voltage applied to the acceleration/deceleration stage 232, for correspondingly adjusting the energy and/or deflection of the ion beam. Such modification of the scan voltage and bias voltage, for example, can be implemented in discrete steps or in a continuous (e.g., not discrete) manner without removing the workpiece from the platen, chuck, clamp or ESC or processing environment, thus providing various advantages over known systems and methodologies.

As previously discussed, implementation of the present invention, may be advantageously applied to high of low temperature ion implantation processes and systems. For example, in a high temperature ion implantation system, the end station 206 can include apparatus for transferring workpieces between atmospheric and vacuum environments of high temperature. A load lock assembly (not shown) may be provided, wherein the load lock assembly may comprise a chamber and a second chamber having a pre-heat apparatus associated therewith, wherein the pre-heat apparatus is configured to heat a workpiece disposed within the chamber to a first temperature. This first temperature may be the desired final processing temperature of the workpiece.

Alternatively, or in addition, the end station 206 can include a thermal apparatus 297, such as a heated platen or chuck on which the workpiece 222 resides during implantation thereof. The thermal apparatus 297, for example, can be configured to heat or cool the workpiece 222 to a second temperature, which may be a desired processing temperature during implantation of ions thereto. The workpiece support 294, for example, may comprise a thermal chuck 298, for example, wherein the thermal chuck 298 is further configured to selectively retain the workpiece thereon within the end station or process chamber/process chamber environment. The thermal chuck, for example, can be configured to heat the workpiece 222 to a predetermined elevated temperature, wherein the thermal chuck retains the workpiece thereon concurrent with the ion beam 212 impinging on the workpiece. The thermal chuck, for example, can comprise a heated electrostatic chuck. Alternatively, the thermal chuck 298 can be configured to cool the workpiece 222 concurrent with ion implantation.

In accordance with one exemplary aspect of the present disclosure, the thermal chuck 298 is configured to heat a workpiece 222 disposed thereon to a temperature that could be on the order of approximately 300° C.-700° C., which may be equal to, lower, or higher than the desired process temperature. In one example, the desired process temperature can generally range between approximately 400° C. to 600° C.

According to another aspect, the end station 206 can include a post-implant cooling apparatus configured to cool the workpiece to yet another temperature when the workpiece is disposed thereto. According to one example, the post-implant cooling apparatus can include a cold plate configured to support the workpiece within a second chamber for cooling the workpiece to a lower temperature before introducing the wafer to atmosphere.

Accordingly, in a high temperature ion implantation system, the controller 292 may be provided and configured to heat the workpiece 222 to the first temperature in the atmospheric environment via the pre-heat apparatus, and to then heat the workpiece to a second, higher temperature via the thermal chuck for heated ion implantation in a high vacuum environment. The controller 292 can be configured to implant ions into the workpiece 222 via the ion implantation apparatus, and to cool the workpiece to the third temperature via the post-implant cooling apparatus. The controller 292, for example, can be further configured to selectively transfer the workpiece 222 between an atmospheric environment and a vacuum processing environment.

Alternatively, an ion implantation system for implanting ions into a cold workpiece is provided. The ion implantation system, for example, comprises an ion implantation apparatus configured to provide an ion beam to a workpiece positioned in a process chamber. In one example, a sub-ambient temperature chuck, such as a cryogenically cooled electrostatic chuck, is configured to support the workpiece within the process chamber during exposure of the workpiece to the ion beam. The cryogenic chuck is further configured to cool the workpiece to a processing temperature. According to one aspect, a load lock chamber may be provided, wherein the load lock chamber is operably coupled to the process chamber and is configured to isolate the process environment from the external environment. The load lock chamber further comprises a workpiece support configured to support the workpiece during a transfer of the workpiece between the process chamber and the intermediate chamber. A pre-chill station may be further positioned within the process chamber or the loadlock, wherein the pre-chill station comprises a chilled workpiece support configured to cool the workpiece to a first temperature. In one example, the first temperature is significantly lower than the process temperature. The pre-chill station, for example, may comprise a cooling plate configured to support the workpiece and to cool the workpiece to the first temperature.

In such a low temperature ion implant system, a post-implant heat station may also be provided, positioned within the process chamber or a load lock chamber, wherein the post-implant heat station comprises a heated workpiece support configured to heat the workpiece to a second temperature. The post-heat station, for example, comprises a heating station support comprising a heating plate configured to support the workpiece and to heat the workpiece to the second temperature before reintroducing the wafer to atmosphere.

A controller may be further configured to determine the first temperature and the second temperature, based, at least in part, on a desired process throughput. A temperature monitoring system, for example, may be configured to measure a temperature of the workpiece at the pre-implant chill station and the post-implant heat station, as well as a temperature of the workpiece on the platen. The controller is thus further configured to control cooling of the workpiece and subsequent heating of the workpiece based, at least in part, on the measured temperature of the workpiece.

It will be understood that various high temperature and low temperature ion implantation systems have been described in the patent literature and otherwise, as well as heated or cooled ion implantation processes. The present invention for providing energy chain implants in an ion implantation system while maintaining the workpiece on a workpiece support in an end station as adjustments are made to the ion beam energy can be implemented in any such ion implantation system.

It will also be understood that the present disclosure can be combined with features known in the art to provide even greater variability of the ion implantation process during ion implantation. For example, as previously indicated, there are disclosures in the prior art directed to the feature of providing variable dose control of implants. The feature of the present disclosure for providing selectively variable energy control of an implant process could be combined with features for providing selectively variable dose control of an ion implant process to achieve selectively variable energy and dose ion implants across the surface of the wafer.

Figure 5:
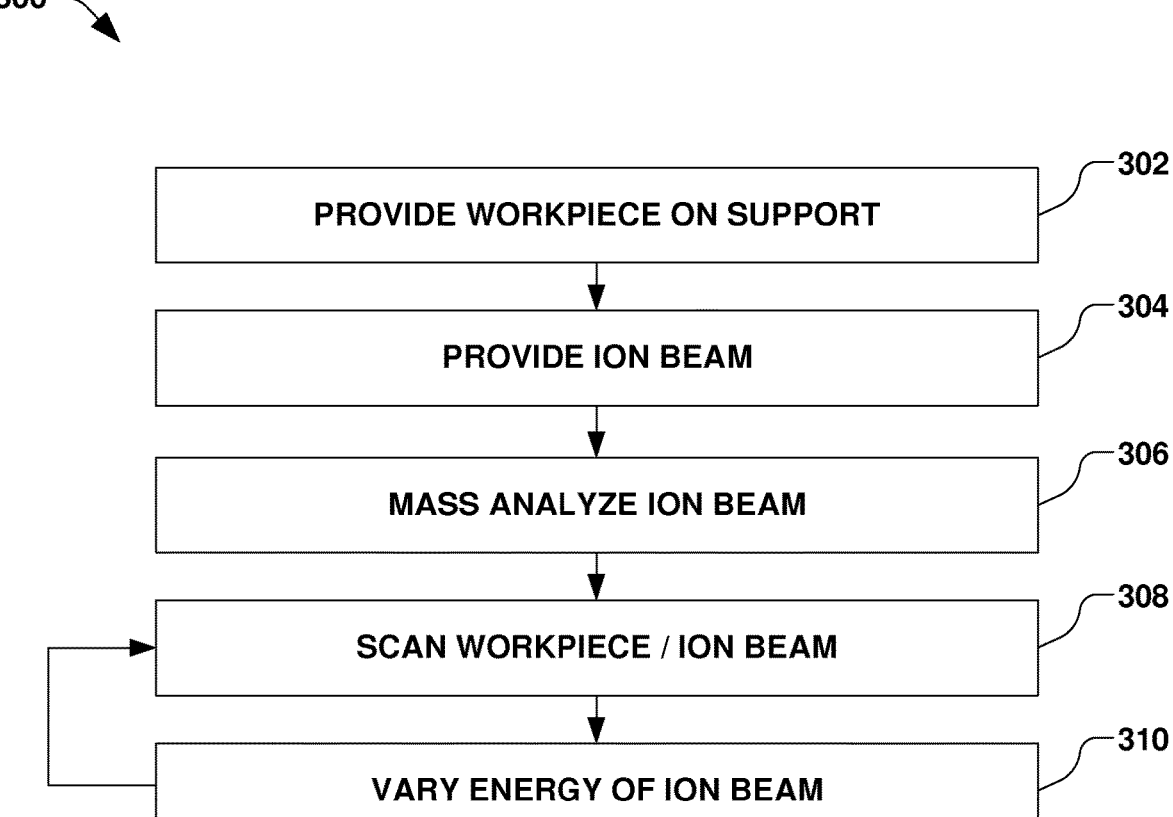
FIG. 5 illustrates a method for optimizing an implantation of ions into a workpiece in accordance with various aspects of the present disclosure.

In accordance with the present disclosure, the system described herein enables a method for implanting ions at varying depths, as illustrated in flowchart form in FIG. 5. It should be noted that while exemplary methods are illustrated and described herein as a series of acts or events, it will be appreciated that the present disclosure is not limited by the illustrated ordering of such acts or events, as some steps may occur in different orders and/or concurrently with other steps apart from that shown and described herein, in accordance with the disclosure. In addition, not all illustrated steps may be required to implement a methodology in accordance with the present disclosure. Moreover, it will be appreciated that the methods may be implemented in association with the systems illustrated and described herein as well as in association with other systems not illustrated.

The method 300 of FIG. 5 begins at act 302 with providing a workpiece on a support. In act 304, an ion beam, such as spot ion beam, is provided, and in act 306, the ion beam may be mass analyzed to define an ion beam having a predetermined charge to mass ratio. In act 308, one or more of the workpiece and ion beam is scanned with respect to the other. For example, the workpiece may be mechanically scanned in two orthogonal directions in act 308. In another alternative, the ion beam is electrostatically or magnetically scanned in a first direction, and mechanically scanned in a second direction. In act 310, an energy of the ion beam is selectively varied from a first energy to a second energy and the scanning of act 308 is subsequently performed again until all energies are implanted. Accordingly, a resultant depth of implantation of ions into the workpiece can be made uniform along a surface of the workpiece.

Thus, the present disclosure is directed to an ion implantation system and method for varying the energy of the ion beam in sequential steps as the workpiece is implanted. The present disclosure is enabled by varying the bias voltages the electrical biases supplied to accel/decel electrodes so that the energy of the ions delivered to a workpiece can be selectively varied to achieve a predetermined variable energy pattern at the workpiece. It will be understood that the present disclosure can be incorporated in a system for providing variable energy implantation in the form of discrete variable energy levels, step function changes in energy or otherwise. Variation in the energy profile across the surface of the workpiece could be symmetrical, and could also be in quadrants or otherwise, such as $X_1$ energy in specified location $Q_1$, $X_2$ energy in $Q_2$, etc. Further, a single workpiece can be implanted with multiple energies in multiple passes through the ion beam The exemplary ion implantation system architecture described herein for illustration purposes is particularly well suited for enabling selective variation in ion beam energy across the surface of a workpiece in that the system 200 of FIG. 3 incorporates a scanned spot beam, where in the beam is scanned electronically or magnetically across the surface of the workpiece. This scanning of a spot beam permits modulation of selective variation of the ion beam energy as the beam is scanned. Thus, as the beam is scanned to strike selected positions on the wafer, it goes through all of the optical elements of the beamline wherein the beam can be modified to change its energy to a selected energy immediately prior to striking the wafer. Changes in the beam energy can be can be accomplished in synchronism with the x and y scanning functions of the scanner and/or end station such that the energy of the scanned beam can be varied as a function of x and/or y.

Advantageously, in the exemplary ion implantation system described herein, the final beam energy can be varied by the electrical bias supplied to a single downstream component, the deceleration/acceleration stage 232, thereby eliminating arduous and complicated tuning requirements typically required when modifying electrical biases supplied to upstream components that can vary ion energies, such as tuning of the extraction electrodes 214 situated immediately downstream of the ion source 208. In addition, the biasing voltages applied to the deceleration/acceleration and the deflecting energy filter can be selectivity varied as a function of the x and y position of the scanned beam, such that the beam can be constrained to travel on the same path to the wafer, independent of the variation of energy of the ion beam.

It will be understood that all of the selective biasing of components and subsystems can be accomplished via control system 292 and can be implemented via a feedback loop input to the acceleration/deceleration stage, as well as the energy filter, based on the location of the beam output from the scanning system. It will be understood, however, that a feedback loop is not a requirement for enabling the selectively variable energy ion implantation features of the present disclosure, as preprogrammed ion beam energy profiles can also be advantageously implemented to execute the selectively variable energy ion implantation of the present disclosure. As such, ion beam energy can be selectively varied per die, or some other feature or region, either via a feedback loop for the x,y coordinate position of the beam on the wafer, or via some predetermined desired pattern.

The selectively variable energy ion implantation of the present disclosure can also be implemented through a map of the workpiece, wherein the selective variation of the one or more voltages respectively supplied to one or more of the electrodes in the electrode column and/or the energy filter is based on a map of a workpiece positioned on the workpiece support. In another alternative, the ion implantation system of the present disclosure can be provided with a detector, or multiple detectors configured to detect one or more properties of a workpiece positioned on the workpiece support, wherein the selective variation of the one or more voltages respectively supplied to one or more of the electrode column of the deceleration/acceleration stage and/or the energy filter is further based on feedback from the detector. In accordance with this alternative embodiment, the detector or detectors may be preferably configured to detect one or more of a thickness of the workpiece, a thickness of a layer disposed on the workpiece, a die pattern on the workpiece, an edge of the workpiece, a center of the workpiece, or a predefined region on the workpiece, wherein the detected information is provided as input to selectively vary the energy of the ion beam.

Although the invention has been illustrated and described with respect to one or more implementations, it will be understood that alterations and/or modifications may be made to the illustrated examples without departing from the spirit and scope of the appended claims. In particular regard to the various functions performed by the above described components or structures (blocks, units, engines, assemblies, devices, circuits, systems, etc.), the terms (including any reference to a "means") used to describe such components are intended to correspond, unless otherwise indicated, to any component or structure which performs the specified function of the described component (e.g., that is functionally equivalent), even though not structurally equivalent to the disclosed structure which performs the function in the herein illustrated exemplary implementations of the invention. In addition, while a particular feature of the invention may have been disclosed with respect to only one of several implementations, such feature may be combined with one or more other features of the other implementations as may be desired and advantageous for any given or particular application. Furthermore, to the extent that the terms "including", "includes", "having", "has", "with", or variants thereof are used in either the detailed description and the claims, such terms are intended to be inclusive in a manner similar to the term "comprising".

What is claimed is:

1. An ion implantation system for producing a chained energy implantation of ions, the ion implantation system comprising:
   an ion source configured to ionize a dopant material and generate an ion beam;
   an acceleration/deceleration stage configured to receive the ion beam, wherein the acceleration/deceleration stage is configured to selectively vary an energy of the ion beam based on one or more inputs thereto, thereby defining a a plurality of discrete energies of the ion beam;
   a single workpiece end station positioned downstream of the acceleration/deceleration stage, wherein the single workpiece end station comprises a workpiece support configured to selectively expose a single workpiece to the ion beam;
   a scanning apparatus configured to scan one or more of the ion beam and the workpiece support with respect to one another along a first scan axis and a second scan axis; and
   a controller configured to control the scanning apparatus and the one or more inputs to the acceleration/deceleration stage to sequentially and uniformly expose an entirety of the single workpiece to each of the plurality of discrete energies of the ion beam, wherein the single workpiece is maintained on the workpiece support within the single workpiece end station concurrent with the selective variation of the energy of the ion beam.

2. The ion implantation system of claim 1, further comprising one or more power sources operably coupled to the acceleration/deceleration stage, and wherein the one or more inputs comprise one or more electrical bias signals.

3. The ion implantation system of claim 2, wherein the acceleration/deceleration stage comprises an electrode column having one or more electrode pairs, and wherein the one or more electrical bias signals are supplied to the one or more electrode pairs of the electrode column.

4. The ion implantation system of claim 3, wherein the electrode column comprises one or more of an ion beam accelerator, an ion beam decelerator, and a bend electrode.

5. The ion implantation system of claim 2, wherein the one or more electrical bias signals comprise one or more of a voltage and a current.

6. The ion implantation system of claim 2, a wherein the controller is operably coupled to the one or more power sources and configured to selectively vary the one or more electrical bias signals supplied to the acceleration/deceleration stage in accordance with a plurality of process recipes.

7. The ion implantation system of claim 1, further comprising a thermal apparatus configured to control a temperature of the single workpiece at a predetermined processing temperature on the workpiece support, and wherein the predetermined process temperature is associated with one of a high temperature configuration of the ion implantation system and a low temperature configuration of the ion implantation system.

8. An ion implantation system configured to provide a selectively variable energy ion beam to a workpiece, the ion implantation system comprising:

an ion source configured to ionize a dopant material and generate an ion beam;

an acceleration/deceleration stage configured to receive the ion beam, wherein the acceleration/deceleration stage is configured to selectively vary an energy of the ion beam based on one or more inputs to the acceleration/deceleration stage, thereby defining a plurality of discrete energies of the selectively variable energy ion beam;

an end station positioned downstream of the acceleration/deceleration stage, wherein the end station comprises a workpiece support configured to selectively position the workpiece before the selectively variable energy ion beam for ion implantation thereby, wherein the workpiece is maintained on the workpiece support within the end station concurrent with the selective variation of the energy of the ion beam;

a scanning apparatus configured to scan one or more of the ion beam and the workpiece support with respect to one another along a first scan axis and a second scan axis to sequentially and uniformly expose an entirety of the single workpiece to each of the plurality of discrete energies of the selectively variable energy ion beam; and a thermal apparatus configured to control a temperature of the workpiece at a predetermined processing temperature on the workpiece support, wherein the predetermined process temperature is associated with one of a high temperature configuration of the ion implantation system and a low temperature configuration of the ion implantation system.

9. The ion implantation system of claim 8, wherein the thermal apparatus comprises a thermal chuck, wherein the thermal chuck is configured to heat the workpiece in the high temperature configuration to greater than approximately 300 C.

10. The ion implantation system of claim 9, further comprising one or more power sources operably coupled to the acceleration/deceleration stage, and wherein the one or more inputs comprise one or more electrical bias signals.

11. The ion implantation system of claim 10, wherein the acceleration/deceleration stage comprises an electrode column having one or more electrode pairs, and wherein the one or more electrical bias signals are supplied to the one or more electrode pairs of the electrode column, and wherein the electrode column comprises one or more of an ion beam accelerator, an ion beam decelerator, and a bend electrode.

12. The ion implantation system of claim 10, further comprising a controller operably coupled to the one or more power sources and configured to selectively vary the one or more electrical bias signals supplied to the acceleration/deceleration stage in accordance with a plurality of process recipes.

13. The ion implantation system of claim 8, wherein the workpiece support comprises a single workpiece support configured to support only one workpiece.

14. An ion implantation system configured to provide a selectively variable energy ion beam to a workpiece, the ion implantation system comprising:

an ion source configured to ionize a dopant material and generate an ion beam;

an acceleration/deceleration stage configured to receive the ion beam, wherein the acceleration/deceleration stage is configured to selectively vary an energy of the ion beam based on one or more inputs to the acceleration/deceleration stage thereby defining the selectively variable energy ion beam at a plurality of discrete energies; and an end station positioned downstream of the acceleration/deceleration stage, wherein end station comprises a workpiece support configured to selectively position the workpiece before the selectively variable energy ion beam for ion implantation thereby, wherein the workpiece is maintained within the end station and continuously exposed to the ion beam concurrent with the selective variation of the energy of the ion beam, and wherein the workpiece support is configured to sequentially and uniformly expose an entirety of the workpiece to each of the plurality of discrete energies of the selectively variable energy ion beam.

15. The ion implantation system of claim 14, further comprising one or more power sources operably coupled to the acceleration/deceleration stage, and wherein the one or more inputs comprise one or more electrical bias signals.

16. The ion implantation system of claim 15, wherein the acceleration/deceleration stage comprises an electrode column having one or more electrode pairs, and wherein the one or more electrical bias signals are supplied to the one or more electrode pairs of the electrode column, and wherein the electrode column comprises one or more of an ion beam accelerator, an ion beam decelerator, and a bend electrode.

17. The ion implantation system of claim 15, further comprising a controller operably coupled to the one or more power sources and configured to selectively vary the one or more electrical bias signals supplied to the acceleration/deceleration stage in accordance with a plurality of process recipes.

18. The ion implantation system of claim 14, further comprising a thermal apparatus configured to control a temperature of the workpiece at a predetermined processing temperature on the workpiece support, and wherein the predetermined process temperature is associated with one of a high temperature configuration of the ion implantation system and a low temperature configuration of the ion implantation system.

19. The ion implantation system of claim 1, wherein each of the plurality of discrete energies is associated with each of a plurality of process recipes, respectively, wherein the controller is further configured to implant the entirety of the workpiece with ions according to each of the plurality of 5 respective process recipes.

20. The ion implantation system of claim 19, wherein each of the plurality of process recipes comprises one or more of the energy of the ion beam, an ion dose of the ion beam, and an implantation angle of the ion beam with 10 respect to the workpiece.

* * * * *